US012376498B2

(12) United States Patent
Lille et al.

(10) Patent No.: US 12,376,498 B2
(45) Date of Patent: Jul. 29, 2025

(54) SOT MRAM INCLUDING MTJ AND SELECTOR LOCATED ON OPPOSITE SIDES OF SOT LAYER AND METHOD OF MAKING THE SAME

(71) Applicant: WESTERN DIGITAL TECHNOLOGIES, INC., San Jose, CA (US)

(72) Inventors: Jeffrey Lille, Sunnyvale, CA (US); Nathan Franklin, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 140 days.

(21) Appl. No.: 18/520,401

(22) Filed: Nov. 27, 2023

(65) Prior Publication Data
US 2025/0176439 A1 May 29, 2025

(51) Int. Cl.
*G11C 11/16* (2006.01)
*G11C 5/08* (2006.01)
*H10N 50/01* (2023.01)
*H10N 50/10* (2023.01)
*H10N 50/80* (2023.01)

(52) U.S. Cl.
CPC .............. *H10N 50/10* (2023.02); *G11C 5/08* (2013.01); *G11C 11/161* (2013.01); *G11C 11/1673* (2013.01); *H10N 50/01* (2023.02); *H10N 50/80* (2023.02)

(58) Field of Classification Search
CPC ........ H10N 50/10; H10N 50/01; H10N 50/80; G11C 5/08; G11C 11/161; G11C 11/1673

USPC ........................................................ 365/158
See application file for complete search history.

(56) References Cited

U.S. PATENT DOCUMENTS

| 9,608,039 | B1 | 3/2017 | Apalkov et al. |
| 10,229,723 | B1 | 3/2019 | Choi et al. |
| 10,381,551 | B1 | 8/2019 | Lille |
| 10,553,783 | B2 | 2/2020 | Lille |
| 10,726,892 | B2 | 7/2020 | Le et al. |
| 11,176,891 | B1 | 11/2021 | Prasad et al. |
| 11,217,289 | B1 | 1/2022 | Prasad et al. |
| 11,271,035 | B2 | 3/2022 | Wan et al. |
| 11,349,066 | B2 | 5/2022 | Kalitsov et al. |
| 11,411,170 | B2 | 8/2022 | Kalitsov et al. |
| 11,417,379 | B2 | 8/2022 | Kalitsov et al. |
| 2014/0056060 | A1 | 2/2014 | Khvalkovskiy et al. |

(Continued)

OTHER PUBLICATIONS

Emori, S., et al., "Current-driven dynamics of chiral ferromagnetic domain walls," *Nature Mater*, Vo. 12, pp. 611-616, (2013). https://doi.org/10.1038/nmat3675.

(Continued)

*Primary Examiner* — Huan Hoang
(74) *Attorney, Agent, or Firm* — THE MARBURY LAW GROUP PLLC

(57) ABSTRACT

A spin-orbit-torque (SOT) memory cell includes a first electrode embedded in dielectric material layers overlying a substrate; a magnetic-tunnel-junction-containing (MTJ-containing) pillar structure contacting a top surface of the first electrode and including a pinned layer and a free layer that overlies the pinned layer; a spin current metal line including a center portion that contacts the MTJ-containing pillar structure; and a selector element electrically connected to a first end of the spin current metal line.

20 Claims, 25 Drawing Sheets

(56) References Cited

U.S. PATENT DOCUMENTS

| | | | |
|---|---|---|---|
| 2014/0056061 A1 | 2/2014 | Khvalkovskiy et al. | |
| 2014/0264671 A1 | 9/2014 | Chepulskyy et al. | |
| 2015/0041934 A1 | 2/2015 | Khvalkovskiy et al. | |
| 2018/0123031 A1* | 5/2018 | Adelmann | H10N 50/80 |
| 2018/0166500 A1 | 6/2018 | Wang et al. | |
| 2018/0350416 A1 | 12/2018 | Choi | |
| 2018/0351087 A1 | 12/2018 | Choi | |
| 2019/0035449 A1 | 1/2019 | Saida et al. | |
| 2020/0006633 A1 | 1/2020 | Lille | |
| 2020/0350364 A1 | 11/2020 | Wan et al. | |
| 2021/0036055 A1 | 2/2021 | Ying et al. | |
| 2021/0098041 A1 | 4/2021 | Kim et al. | |
| 2022/0285609 A1 | 9/2022 | Huang et al. | |
| 2023/0189662 A1 | 6/2023 | Yoshikawa | |

OTHER PUBLICATIONS

Song, C. et al., "Spin-orbit torques: Materials, mechanisms, performances, and potential applications," Progress in Materials Science, vol. 118, (2021), 100761, ISSN 0079-6425, https://doi.org/10.1016/j.pmatsci.2020.100761.

U.S. Appl. No. 17/654,768, filed Mar. 14, 2021, SanDisk Technologies LLC.

U.S. Appl. No. 18/453,555, filed Aug. 22, 2023, Western Digital Technologies, Inc.

Lille, J. et al., "SOT MRAM Including MTJ And Selector Located on Opposite Sides Of Sot Layer And Method Of Making The Same," U.S. Appl. No. 18/520,299, filed Nov. 27, 2023.

* cited by examiner

SOT MRAM INCLUDING MTJ AND SELECTOR LOCATED ON OPPOSITE SIDES OF SOT LAYER AND METHOD OF MAKING THE SAME

FIELD

The present disclosure relates generally to the field of magnetic memory devices, and particular to spin-orbit torque magnetoresistive memory cells including magnetic tunnel junction (MTJ) and selector located on opposite sides of the SOT layer and methods of manufacturing the same.

BACKGROUND

Spin-orbit torque (SOT) magnetoresistive random access memory (MRAM) devices (also known as magnetic random access memory devices) use switching of magnetization direction of a free magnetic layer by injection of an in-plane current in an adjacent conductive layer, which is referred to as a spin-orbit torque (SOT) layer. Unlike spin torque transfer (STT) magnetoresistive random access memory (MRAM) devices in which the write current flows through the magnetic tunnel junction, the write operation is performed by flowing an electrical current through an adjacent conductive layer. The read operation of a SOT memory cell is performed by passing electrical current through the magnetic tunnel junction of the SOT memory cell.

SUMMARY

According to an aspect of the present disclosure, a spin-orbit-torque (SOT) magnetoresistive memory device comprising at least one SOT memory cell is provided. Each of the at least one SOT memory cell overlies a substrate and comprises: a first electrode embedded in dielectric material layers overlying the substrate; a magnetic-tunnel-junction-containing (MTJ-containing) pillar structure contacting a top surface of the first electrode and comprising a ferromagnetic pinned layer, a ferromagnetic free layer that overlies the pinned layer, and a tunneling barrier layer located between the free layer and the pinned layer; a spin current metal line including a center portion that overlies and contacts the MTJ-containing pillar structure; a selector element that overlies and is electrically connected to a first end of the spin current metal line; and a third electrode that is electrically connected to a second end of the spin current metal line.

According to another aspect of the present disclosure, a method of forming a magnetoresistive memory device comprises: forming a first electrode over a substrate; forming a magnetic-tunnel-junction-containing (MTJ-containing) pillar structure on the first electrode, wherein the MTJ-containing pillar structure comprises a ferromagnetic pinned layer, a ferromagnetic free layer that overlies the pinned layer and a tunneling barrier layer located between the free layer and the pinned layer; forming a spin current metal line on the MTJ-containing pillar structure; forming a selector element on a surface of a first end of the spin current metal line and laterally offset from the MTJ-containing pillar structure; and forming a third electrode on surface of a second end of the spin current metal wire.

According to yet another aspect of the present disclosure, a spin-orbit-torque (SOT) magnetoresistive memory device comprising at least one SOT memory cell is provided. Each of the at least one SOT memory cell overlies a substrate and comprises: a first electrode embedded in dielectric material layers overlying the substrate; a magnetic-tunnel-junction-containing (MTJ-containing) pillar structure contacting a top surface of the first electrode and comprising a ferromagnetic pinned layer, a ferromagnetic free layer that overlies the pinned layer, a tunneling barrier layer located between the free layer and the pinned layer, and a non-ferromagnetic coupling layer that overlies the free layer; a spin current metal line including a portion that contacts the non-ferromagnetic coupling layer of the MTJ-containing pillar structure; and a second electrode and a third electrode which overlie the MTJ containing pillar and which are electrically connected to the spin current metal line.

According to still another aspect of the present disclosure, a method of forming a magnetoresistive memory device comprises: forming a first electrode over a substrate; forming a magnetic-tunnel-junction-containing (MTJ-containing) pillar structure on the first electrode, wherein the MTJ-containing pillar structure comprises a ferromagnetic pinned layer and a ferromagnetic free layer; forming an MTJ-level dielectric material layer over and around the MTJ-containing pillar structure; forming a stress-generating dielectric layer over the MTJ-level dielectric material layer; chemically mechanically polishing the MTJ-level dielectric material layer and the stress-generating dielectric layer using horizontal portions of the stress-generating dielectric layer as a polish stop to expose a top surface of the MTJ containing pillar structure; and forming a spin current metal line on the top surface of the MTJ-containing pillar structure.

DETAILED DESCRIPTION

Figure 1:
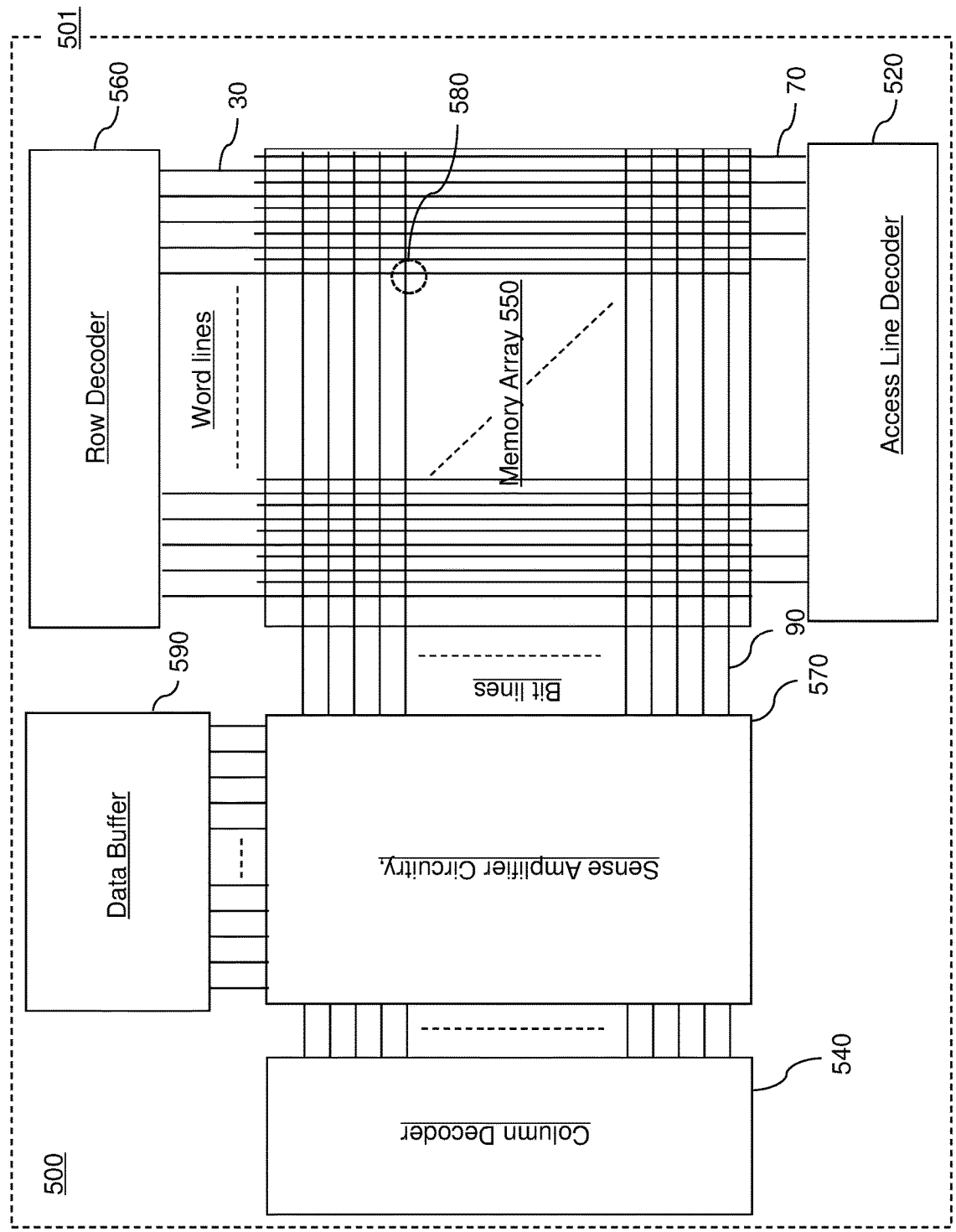
FIG. 1 is a schematic diagram of a memory device including spin-orbit-torque magnetoresistive random access memory cells in an array configuration according to the embodiments present disclosure.

As discussed above, the present disclosure is directed to spin-orbit-torque magnetoresistive memory cells including magnetic tunnel junction (MTJ) and selector located on opposite sides of the SOT layer, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified. As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "metallic material" refers to a conductive material including at least one metallic element therein. All measurements for electrical conductivities are made at the standard condition.

Magnetization switching via spin-orbit torque (SOT) is a promising alternative to direct spin-transfer torque (STT) for writing bits in magnetoresistive random access memory (MRAM) cells. A typical SOT memory cell includes a nonmagnetic heavy metal SOT layer with strong spin-orbit coupling with, and optionally in contact with, a ferromagnetic free layer that can switch magnetization directions. When an electric write current laterally passes through the nonmagnetic heavy metal SOT layer, spin current is generated in a direction perpendicular to the electrical current via the spin Hall effect (SHE). The spin current exerts a torque on the magnetization of the free layer. Thus, the nonmagnetic heavy metal SOT layer assists in the transition of the magnetization direction in the free layer through the spin Hall effect. Thus, the nonmagnetic heavy metal SOT layer is also referred to as metallic assist layer, i.e., a metallic layer that assists the magnetic transition in the free layer. When a nonmagnetic heavy metal SOT layer is patterned in the shape of a metal line, such a nonmagnetic heavy metal SOT layer is referred to herein as spin current metal line. Since very little electrical current flows through the magnetic tunnel junction (including the free layer) during programming of the memory cell, SOT memory cells generally exhibit higher endurance with lower write error rate than spin-transfer torque (STT) memory cells. In addition, SOT memory cells require lower write-energy than STT memory cells. Finally, SOT switching can achieve nanosecond, and even sub-nanosecond writing speeds.

Referring to FIG. 1, a schematic diagrams is shown for a memory device 500 including an array of unit cells 580. The memory device 500 may comprise a spin-orbit torque (SOT) magnetoresistive memory device. Each unit cell 580 includes a combination of a magnetoresistive memory cell, an access transistor, and a selector element. The memory device 500 can be configured as a magnetoresistive random access memory (MRAM) device containing spin-orbit torque (SOT) memory cells. As used herein, a "random access memory device" refers to a memory device containing cells that allow random access, e.g., access to any selected memory cell upon a command for reading the contents of the selected memory cell.

The memory device 500 of an embodiment of the present disclosure includes a memory array region 550 containing an array of unit cells 580 located at intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). Each unit cell 580 can include a series connection of a SOT memory cell and an access transistor and an optional selector element. Access lines 70 are provided to access the memory cell (e.g., the magnetic tunnel junction) at each cross-point at which a word line intersects a bit line. In one embodiment, the access lines 70 may be connected to a respective row of gate electrodes of the access transistors. In one embodiment, the memory device 500 is in a cross-point array configuration with additional access lines 70 that access a row of access transistors. A source line having a fixed voltage (such as an electrical ground voltage) may be connected to a node of the unit cells 580. For example, the common source line may be electrically connected to the source regions of the access transistors.

The memory device 500 contains a row decoder 560 connected to the word lines, sense circuitry 570 (e.g., a sense amplifier and other bit line control circuitry) connected to the bit lines, a column decoder 540 connected to the bit lines, and a data buffer 590 connected to the sense circuitry. In the first embodiment, the memory device 500 can contain an access line decoder 520 connected to access lines 70 if transistor circuit selection elements are used to write to a respective SOT memory cell. Multiple instances of the magnetoresistive memory cells are arranged in an array configuration that forms the memory device 500. It should be noted that the location and interconnection of elements are schematic, and the elements may be arranged in a different configuration. Further, the SOT memory cell of the embodiments of the present disclosure may be manufactured as a discrete device, i.e., a single isolated device. Conversely, said device 500 may be integrated within a larger system 501.

Figure 2:
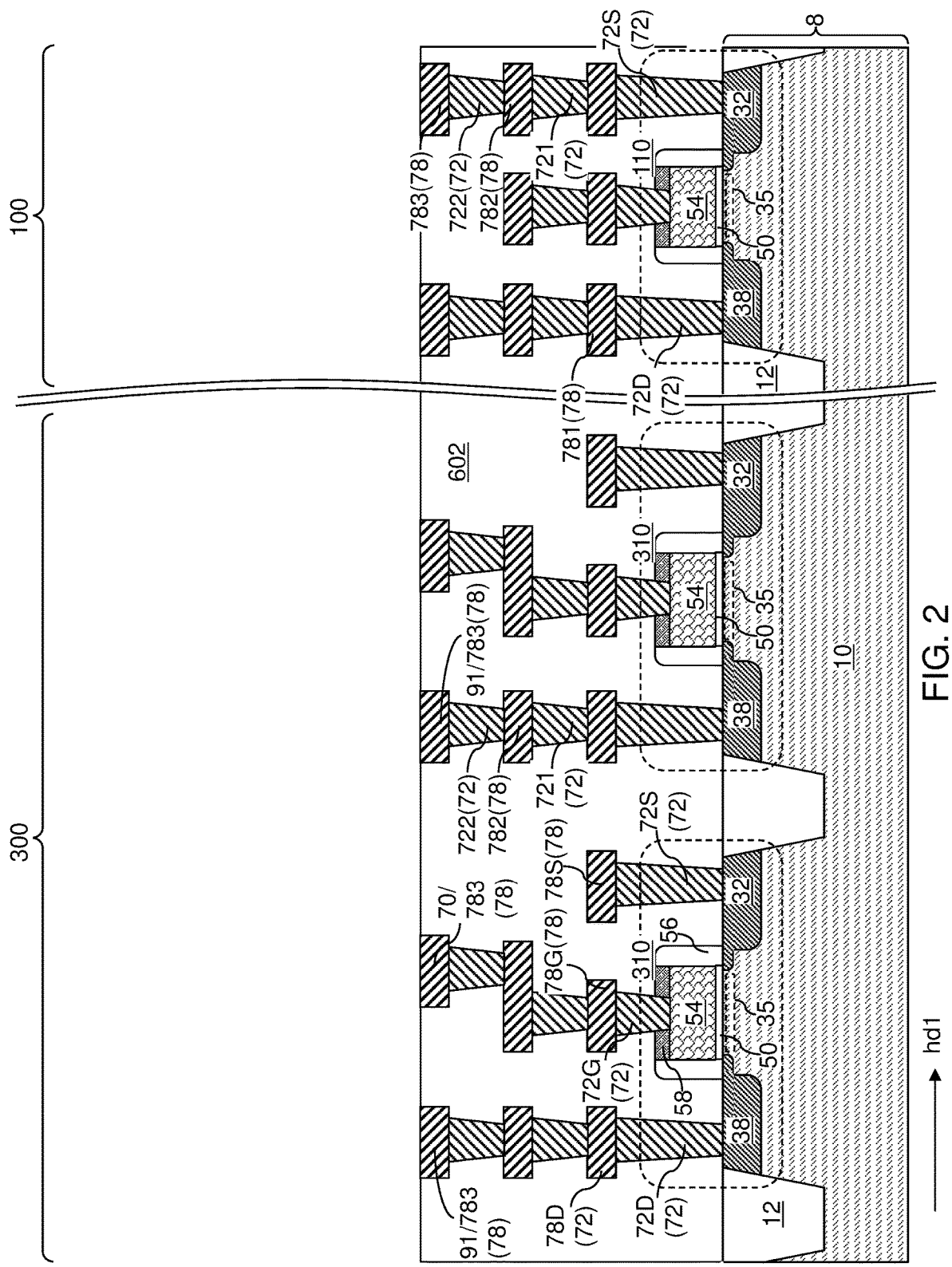
FIG. 2 is a vertical cross-sectional view of a first exemplary structure after formation of field effect transistors, and lower-level metal interconnect structures embedded in lower-level dielectric material layers according to a first embodiment of the present disclosure.

Referring to FIG. 2, a first exemplary structure is illustrated. The first exemplary structure comprises a substrate 8 including a semiconductor material layer 10, which may be a single crystalline semiconductor material layer such as a single crystalline silicon layer. The semiconductor material layer 10 may comprise a doped well in an upper portion of the substrate 8 or an semiconductor layer that is deposited over the top surface of the substrate 8. In one embodiment, the substrate 8 comprises a semiconductor substrate, such as a commercially available bulk silicon wafer or different semiconductor alloy. In this case, the semiconductor material layer 10 may comprise a doped silicon well in an upper portion of the silicon wafer. Alternatively, the substrate 8 may comprise a commercially available silicon-on-insulator (SOI) wafer. In this case, the semiconductor material layer 10 may comprise a silicon layer located over an insulating material. Shallow trench isolation structures 12 can be formed in an upper portion of the semiconductor material layer 10. Various semiconductor devices can be formed on and/or in the top portion of the semiconductor material layer 10.

In one embodiment, the first exemplary structure comprises a memory array region 300 in which a memory array is formed, and a peripheral region 100 in which peripheral devices configured to control operation of the memory array is formed. The peripheral region 100 may include the above described decoders (520, 540, 560), the sense amplifier circuitry 570 and/or the data buffer 590. The various semiconductor devices that are formed on the semiconductor material layer 10 may comprise field effect transistors (310, 110) and optionally other devices, such as resistors, diodes, capacitors and/or any other suitable semiconductor devices that may be employed as components of the memory array, or may be employed to support operation of the memory array.

In an illustrative example, the shallow trench isolation structures 12 may comprise a two-dimensional array of openings within the memory array region 300, and may have an additional set of openings in the peripheral region 100. Each opening in the shallow trench isolation structures 12 in the memory array region 300 defines an active region for a respective access transistor 310 that controls access to a respective memory cell (e.g., magnetic tunnel junction) to be subsequently formed. Each opening in the shallow trench isolation structures 12 in the peripheral region 100 defines an active region for a respective peripheral transistor 110, which may be employed as a component of the peripheral circuit that is formed in the peripheral region 100. Each of the access transistors 310 and the peripheral transistors 110 may comprise a respective source region 32, a respective drain region 38, a respective channel region 35, a respective gate dielectric 50, a respective gate electrode 54, an optional respective gate cap dielectric 58, and an optional respective dielectric gate spacer 56.

Dielectric material layers and metal interconnect structures (72, 78) can be subsequently formed over the substrate 8 and the field effect transistors (310, 110). A subset of the dielectric material layers that is formed prior to formation of magnetoresistive memory devices is herein referred to as lower-level dielectric material layers 602. A subset of the metal interconnect structures that is formed prior to formation of magnetoresistive memory devices is herein referred to as lower-level metal interconnect structures. The metal interconnect structures (72, 78) comprise metal via structures 72 and metal lines 78. In an illustrative case, the metal via structures 72 embedded within the lower-level dielectric material layers 602 may comprise source contact via structures 72S contacting a source region 32 of a respective field effect transistor (310, 110), drain contact via structures 72D contacting a drain region 38 of a respective field effect transistor (310, 110), gate contact via structures 72G contacting a gate electrode 54 of a respective field effect transistor (310, 110), first-via-level metal via structures 721, and second-via-level metal via structures 722. The metal lines 78 embedded within the lower-level dielectric material layers 602 may comprise source lines 78S that are connected to a respective subset of the source contact via structures 72S, drain connection metal lines 78D that are connected to a respective drain contact via structure 72D, gate connection metal lines 78G that are connected to a respective gate contact via structure 72G, second-line-level metal lines 782 contacting at least one first-via-level metal via structure 721 and/or at least one second-via-level metal via structure 722, and third-line-level metal lines 783 that may contact at least one second-via-level metal via structures 722. In another embodiment, metal component 783 may comprise a metal via as a bottom point contact to a device.

In one embodiment, the channel 35 direction of each access transistor 310 may be parallel to a first horizontal direction hd1. As used herein, a channel direction of a field effect transistor refers to a direction along which a source region 32 and a drain region 38 of the field effect transistor are spaced apart. A second horizontal direction can be defined as a horizontal direction that is perpendicular to the first horizontal direction hd1. In one embodiment, source regions 32 within at least one column of access transistors 310 arranged along the first horizontal direction hd1 may be interconnected to each other by a respective common source line 78S, which laterally extends along the first horizontal direction hd1 with a lateral offset from the drain connection metal lines 78D and the gate connection metal lines 78G within the column of access transistors 310. Alternatively or additionally, source regions 32 within a row of access transistors 310 arranged along the second horizontal direction may be interconnected to each other by the same or different respective common source line 78S, which laterally extends along the second horizontal direction.

In one embodiment, the gate connection metal lines 78G or a subset of the third-line-level metal lines 783 may be employed as the access lines 70. Each access line 70 is electrically connected to a respective row of gate electrodes 54 of access transistors 310 arranged along the second horizontal direction. As such, each access line 70 may be employed to turn on, i.e., activate, a respective row of access transistors 310 arranged along the second horizontal direction. According to an aspect of the present disclosure, another subset of the metal lines 78, such as a subset of the third-line-level metal lines 783, may be employed as first electrodes (e.g., read electrodes) 91 for an array of memory elements (e.g., magnetic tunnel junctions) to be subsequently formed.

The metal interconnect structures (78, 72) comprise at least one metal providing high electrical conductivity. In one embodiment, the metal interconnect structures (78, 72) may comprise a combination of a metallic barrier liner including a conductive metallic barrier material (such as TiN, TaN, WN, MON, etc.) and a metal fill material such as Al, Cu, W, Mo, Ru, Co, etc.

The peripheral transistors 110 and a subset of the metal interconnect structures (78, 72) formed in the peripheral region 100 can be configured to provide a peripheral circuit. The peripheral circuit is configured to control operation of a memory array in the memory array region 300. The memory array region 300 may include a two-dimensional array of access transistors 310 and a two-dimensional array of SOT memory cells (e.g., magnetic tunnel junctions) and optional selectors to be subsequently formed.

While an embodiment is described in which the first electrodes 91 of the memory units 580 are formed as a subset of the third-line-level metal lines 783, embodiments are expressly contemplated herein in which the first electrodes 91 are formed at the level of the first-line-level metal lines 781, at the level of the second-line-level metal lines 782, or at the level of metal lines that are formed at a fourth metal line level or above. Alternatively, the first electrodes 91 may be formed at a via level, i.e., between neighboring pairs of metal line levels. Generally, each first electrode 91 may be electrically connected to a drain region 38 of a respective access transistor 310. The top surfaces of the first electrodes 91 may be formed within a horizontal plane including a topmost surface of the lower-level dielectric material layers 602.

Figure 3:
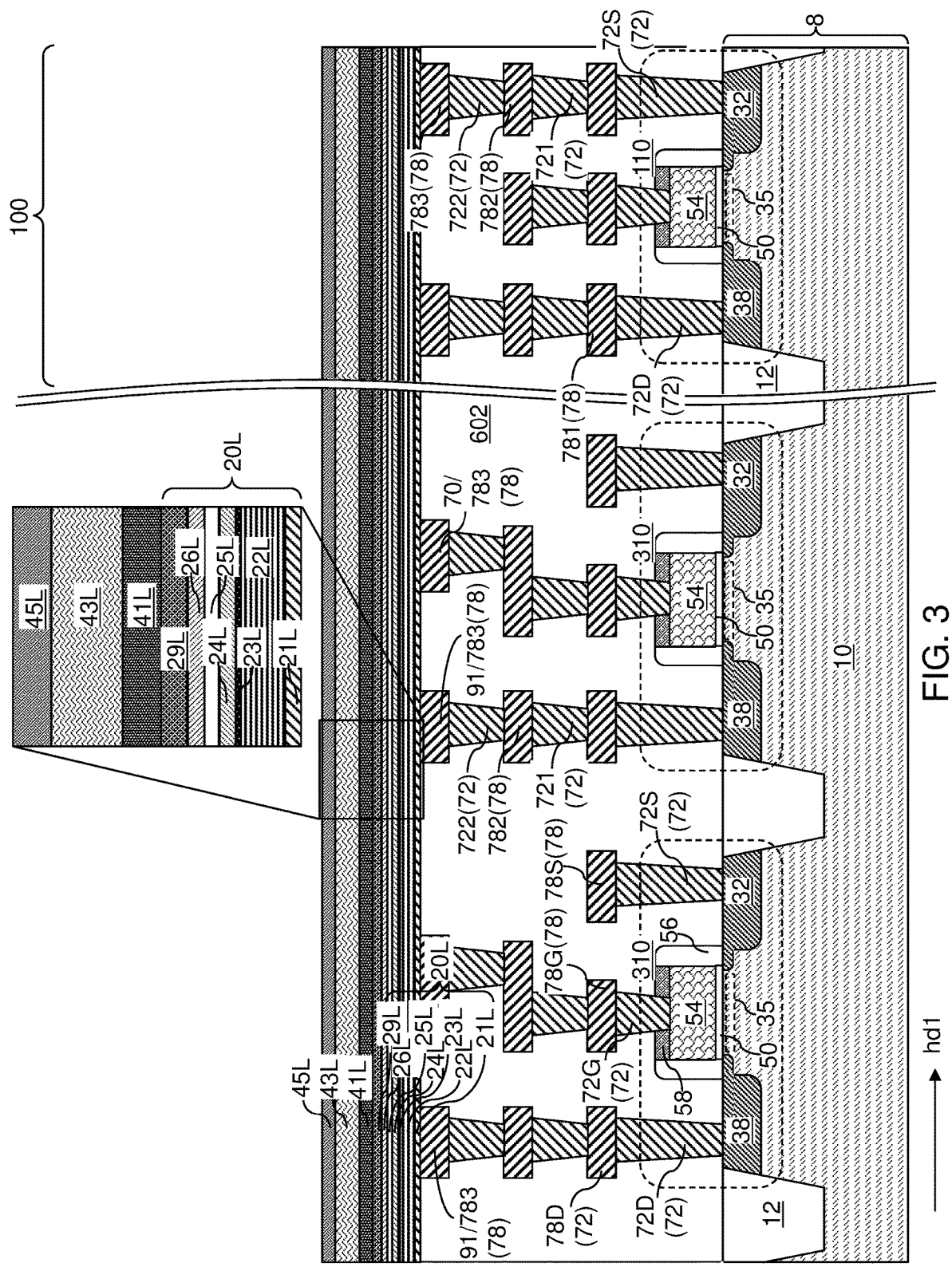
FIG. 3 is a vertical cross-sectional view of the first exemplary structure after formation of magnetic tunnel junction stack material layers and mask-level material layers according to the first embodiment of the present disclosure.

Referring to FIG. 3, magnetic tunnel junction (MTJ) stack material layers 20L and mask-level material layers (41L, 43L, 45L) can be formed over the lower-level dielectric material layers 602 and the lower-level metal interconnect structures (78, 72) that are embedded in the dielectric material layers 602. As used herein, MTJ stack material layers 20L refer to a set of material layers that are subsequently employed to pattern magnetic-tunnel-junction-containing pillar structures, i.e., pillar structures that include a respective magnetic tunnel junction therein. Mask-level material layers (41L, 43L, 45L) refer to material layers that are subsequently employed to form patterned mask structures.

In an illustrative example, the MTJ stack material layers 20L may comprise, from bottom to top, an optional continuous metallic seed layer 21L, a pinning layer 22L, an optional continuous antiferromagnetic coupling layer 23L, a continuous ferromagnetic pinned (i.e., reference) layer 24L, a continuous tunneling barrier layer 25L, a continuous ferromagnetic free layer 26L, and an optional non-ferromagnetic metallic coupling layer 29L. In one embodiment, the pinning layer 22L, the continuous antiferromagnetic coupling layer 23L, and the continuous ferromagnetic pinned layer 24L form a synthetic antiferromagnetic structure (SAF).

The optional continuous metallic seed layer 21L may comprise a metal such as tantalum or platinum. The thickness of the continuous metallic seed layer 21L may be in a range from 1 nm to 10 nm, such as from 2 nm to 4 nm, although lesser and greater thicknesses may also be employed. Alternatively, the continuous metallic seed layer 21L may be omitted.

The pinning layer 22L comprises at least one material layer that can fix the magnetization direction of the continuous pinned (i.e., reference) layer 24L. The pinning layer 22L may comprise a Co/Pt, Co/Pd or Co/Ni superlattice, an exchange-bias-inducing antiferromagnetic layer, such as an IrMn alloy layer, a stack of at least one ferromagnetic material layer and at least one antiferromagnetic layer, or a ferromagnetic material layer that can be coupled to the continuous pinned layer 24L through the continuous antiferromagnetic coupling layer 23L. If the Co/Pt, Co/Pd, or Co/Ni superlattice is used in the pinning layer 22L, then the number of repetitions of a repetition unit (i.e., a bilayer stack) may be in a range from 2 to 20, although lesser and greater numbers of repetition may also be used.

The optional continuous antiferromagnetic coupling layer 23L, if used, comprises a material that can provide antiferromagnetic coupling between the continuous pinned layer 24L and a most proximal ferromagnetic material layer within the pinning layer 22L. The continuous antiferromagnetic coupling layer 23L may comprise a material such as ruthenium, an iridium manganese alloy (if the pinning layer comprises a superlattice), an iron manganese alloy, etc. The thickness of the continuous antiferromagnetic coupling layer 23L may be in a range from 1 nm to 4 nm, although lesser and greater thicknesses may also be employed. Alternatively, a nonmagnetic metal coupling layer may be used instead of the antiferromagnetic coupling layer 23L.

The continuous pinned (i.e., reference) layer 24L comprises a ferromagnetic material. For example, the continuous pinned layer 24L may comprise a ferromagnetic material selected from Ni, Fe, Co, and/or alloys thereof. For example, the continuous pinned layer 24L may comprise CoFe, CoFeB, NiFe, etc. The thickness of the continuous pinned layer 24L may be in a range from 2 nm to 10 nm, such as from 3 nm to 6 nm, although lesser and greater thicknesses may also be employed.

The continuous tunneling barrier layer 25L may comprise insulating material, such as magnesium aluminum oxide spinel or MgO. The thickness of the continuous tunneling barrier layer 25L may be in a range from 0.5 nm to 2 nm, although lesser and greater thicknesses may also be employed.

The continuous free layer 26L may comprise a ferromagnetic material selected from Ni, Fe, Co, and/or alloys thereof, such as CoFe, CoFeB, NiFe, etc. The thickness of the continuous free layer 26L may be in a range from 2 nm to 10 nm, such as from 3 nm to 6 nm, although lesser and greater thicknesses may also be employed. The magnetization direction of the continuous free layer 26L may be parallel to or may be antiparallel to the magnetization direction of the continuous pinned layer 24L.

The optional nonmagnetic metallic coupling layer 29L comprises and/or consists essentially of at least one first metal. In one embodiment, the first metal has a lower resistivity than the spin current metal lines (e.g., the SOT layer) to be subsequently formed. In one embodiment, the first metal has an atomic number in a range from 72 to 79. In this embodiment, the first metal is selected from hafnium, tantalum, tungsten, rhenium, osmium, iridium, platinum, or gold. A metal with a high atomic number is preferable for increasing the spin Hall effect. The nonmagnetic metallic coupling layer 29L may comprise the first metal at a total atomic percentage greater than 90%, and/or greater than 99%, and/or greater than 99.9%. The thickness of the nonmagnetic metallic coupling layer 29L can be preferably selected to be as small as possible while ensuring that the top surface of the continuous free layer 26L is not physically exposed during subsequent processing steps. In one embodiment, the thickness of the nonmagnetic metallic coupling layer 29L may be in a range from 1 nm to 20 nm, such as from 2 nm to 6 nm, although lesser and greater thicknesses may also be employed. Alternatively, the nonmagnetic metallic coupling layer 29L may be omitted.

The nonmagnetic metallic coupling layer 29L is deposited in the same process as the deposition of the previous free layer 26L to avoid interface issues. In alternative embodiments, the coupling layer 29L may comprise a synthetic antiferromagnet, a ferrimagnet whose magnetic moment is less than 10% of free layer 26L, or a Heusler compound which includes a metal having an atomic number in a range from 25 to 28. In one embodiment, an additional interface layer may be present between the free layer 26L and the coupling layer 29L to prevent interdiffusion between the free layer 26L and the coupling layer 29L.

The mask-level material layers (41L, 43L, 45L) comprise a suitable material layer stack that may be patterned and subsequently employed as an etch mask during patterning of the MTJ stack material layers 20L. If an ion beam etching (IBE) process is subsequently employed to pattern the MTJ stack material layers 20L, the mask-level material layers (41L, 43L, 45L) comprise a suitable set of material layers that can be employed as an etch mask during the IBE process. In an illustrative example, the mask-level material layers (41L, 43L, 45L) may comprise, from bottom to top, a first metal mask layer 41L, a carbon-based mask layer 43L, and a second metal mask layer 45L. In an illustrative example, the first metal mask layer 41L may comprise tantalum nitride, the carbon-based mask layer 43L may comprise diamond-like carbon (DLC), and the second mask layer 45L may comprise an etchable hardmask such as chromium or a sacrificial material.

Figure 4:
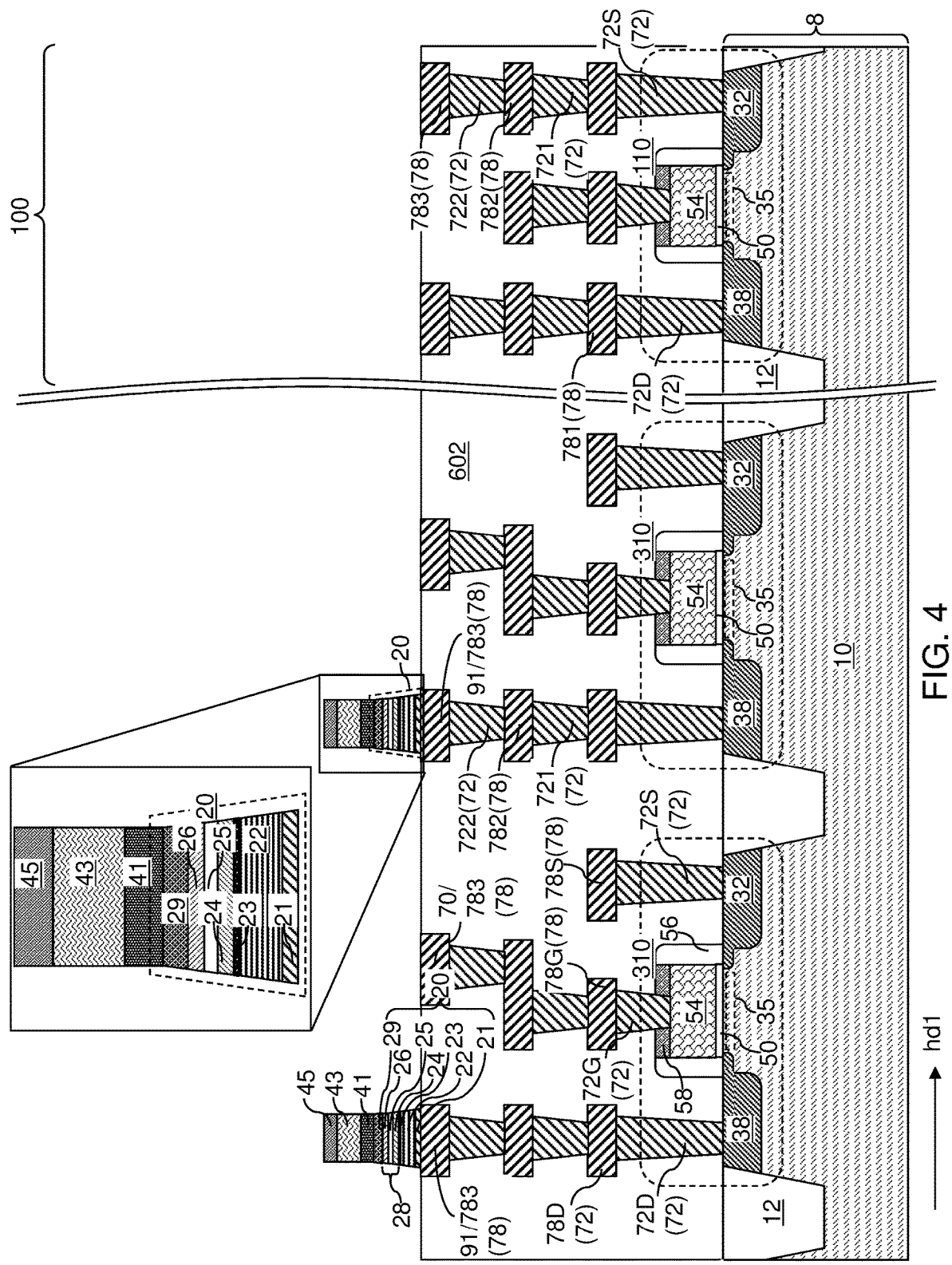
FIG. 4 is a vertical cross-sectional view of the first exemplary structure after formation of mask stacks and magnetic-tunnel-junction-containing pillar structures according to the first embodiment of the present disclosure.

Referring to FIG. 4, a photoresist layer (not shown) can be applied over the mask-level material layers (41L, 43L, 45L), and can be lithographically patterned to form a two-dimensional array of discrete photoresist material portions. Each discrete photoresist material portion may overlie a respective one of the first electrodes 91, and may be located entirely within the area of the respective one of the first electrodes 91 in a plan view (such as a top-down view). In one embodiment, the first electrodes 91 may be arranged as a periodic two-dimensional array having a first periodicity along the first horizontal direction hd1 and having a second periodicity along the second horizontal direction, and the discrete photoresist material portions may be arranged as a periodic two-dimensional array having the same two-dimensional periodicity as the periodic two-dimensional array of the first electrodes 91. The horizontal cross-sectional shape of each discrete photoresist material portion may be a circle, an ellipse, a rounded rectangle, a rectangle, or any other closed curvilinear shape having a closed periphery.

An IBE and/or a reactive ion etch process can be performed to transfer the pattern of the array of discrete photoresist material portions through the mask-level material layers (41L, 43L, 45L). The patterned portions of the mask-level material layers (41L, 43L, 45L) comprise a two-dimensional array of mask patterns (41, 43, 45). Each mask pattern (41, 43, 45) may comprise a respective stack of a first metal mask portion 41, a carbon-based mask portion 43, and a second metal mask portion 45. The photoresist layer can be subsequently removed, for example, by ashing.

An ion beam etch process can be performed to transfer the pattern of a two-dimensional array of mask patterns (41, 43, 45) through the MTJ stack material layers 20L. The MTJ stack material layers 20L are patterned into a two-dimensional array of magnetic-tunnel-junction-containing pillar structures 20, which are also referred to as MTJ-containing pillar structures 20. As used herein, a magnetic-tunnel-junction-containing pillar structures refer to pillar structures that contain a magnetic tunnel junction therein.

Each MTJ-containing pillar structure 20 can be formed on a top surface of a respective first electrode 91. Each MTJ-containing pillar structure 20 may comprise, from bottom to top, an optional metallic seed layer 21, a pinning structure 22, an optional antiferromagnetic coupling layer 23, a pinned layer 24, a tunneling barrier layer 25, a free layer 26, and a nonmagnetic coupling layer 29. The metallic seed layer 21 is a patterned portion of the continuous metallic seed layer 21L, the pinning structure 22 is a patterned portion of the pinning layer 22L, the antiferromagnetic coupling layer 23 is a patterned portion of the continuous antiferromagnetic coupling layer 23L, the pinned layer 24 comprises a patterned portion of the continuous pinned layer 24L, the tunneling barrier layer 25 comprises a patterned portion of the continuous tunneling barrier layer 25L, the free layer 26 comprises a patterned portion of the continuous free layer 26L, and the nonmagnetic coupling layer 29 comprises a portion of the nonmagnetic metallic coupling layer 29L. The combination of the pinned layer 24, the tunneling barrier layer 25, the free layer 26 constitutes a magnetic tunnel junction structure 28.

Each MTJ-containing pillar structure 20 may have a respective tapered sidewall. The taper angle of the tapered sidewalls of the MTJ-containing pillar structures 20, as measured relative to the vertical direction, may be in a range from 0.1 degree to 20 degrees, such as from 1 degree to 10 degrees, although lesser and greater taper angles may also be employed.

Each MTJ-containing pillar structure 20 contacts a top surface of a respective first electrode 91, and comprises a pinned layer 24 and a free layer 26 that overlies the pinned layer 24. In one embodiment, within each of the at least one SOT memory cell 380 illustrated in FIG. 10, the MTJ-containing pillar structure 20 comprises a pinning structure 22 that underlies and is magnetically coupled to the pinned layer 24. The pinning structure 22 pins the magnetization direction of the pinned layer 24. The pinning structure 22, the antiferromagnetic coupling layer 23 and the pinned layer 24 may comprise a synthetic antiferromagnetic (SAF) or an exchange-biased layer structure. In one embodiment, the MTJ-containing pillar structure 20 within each of the at least one SOT memory cell 380 comprises a nonmagnetic coupling layer 29 in direct contact with a top surface of the free layer 26 and comprising at least one first metal having an atomic number in a range from 72 to 79 at a total atomic percentage greater than 99%. In one embodiment, a periphery of a bottom surface of the nonmagnetic coupling layer 29 coincides with a periphery of a top surface of the free layer 26 within each MTJ-containing pillar structure 20. In other words, a bottom periphery of the nonmagnetic coupling layer 29 may coincide with a top periphery of the free layer 26. Alternatively, the nonmagnetic coupling layer 29 may be omitted.

Figure 5:
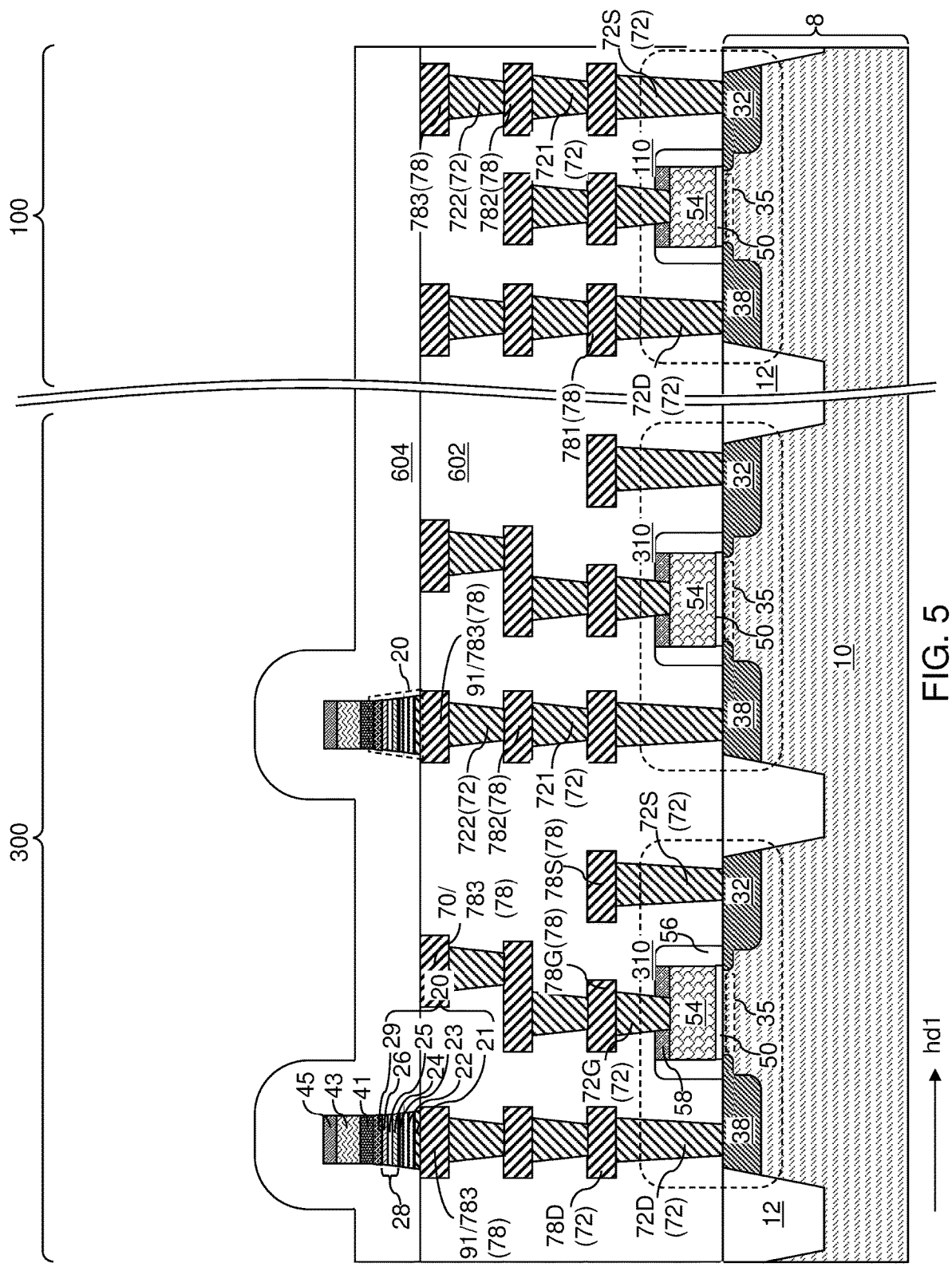
FIG. 5 is a vertical cross-sectional view of the first exemplary structure after formation of a magnetic-junction-level (MTJ-level) dielectric material layer according to the first embodiment of the present disclosure.

Referring to FIG. 5, a dielectric material layer can be deposited around the two-dimensional array of MTJ-containing pillar structures 20. The dielectric material layer is herein referred to as a magnetic-junction-level dielectric material layer 604, or an MTJ-level dielectric material layer 604. The dielectric material of the MTJ-level dielectric material layer 604 may comprise silicon nitride, undoped silicate glass (i.e., silicon oxide), a doped silicate glass, organosilicate glass, etc. The dielectric material of the MTJ-level dielectric material layer 604 may be deposited by chemical vapor deposition, atomic layer deposition or spin-coating. The thickness of a horizontally-extending portion of the MTJ-level dielectric material layer 604 is greater than the height of each MTJ-containing pillar structure 20.

Figure 6:
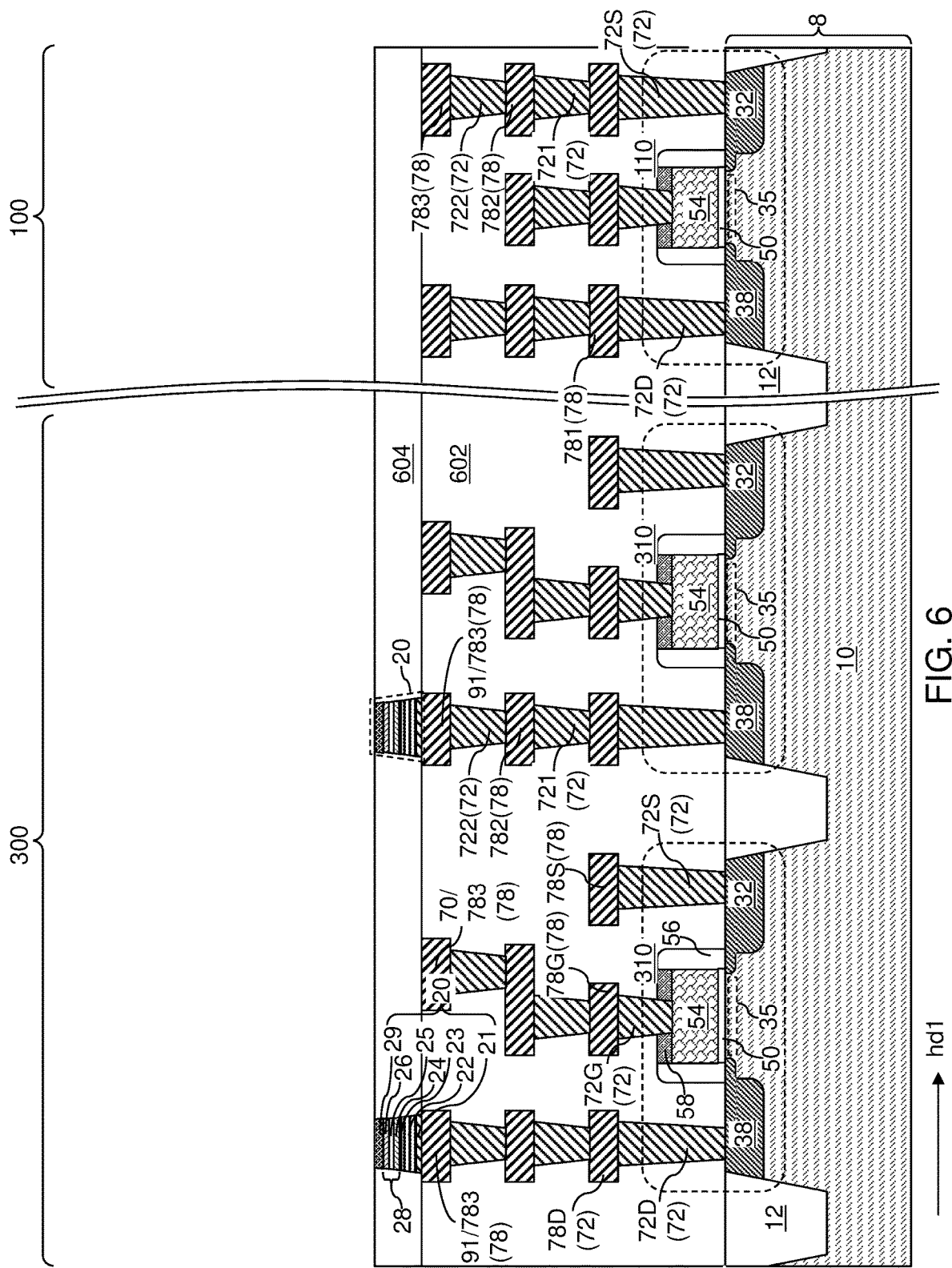
FIG. 6 is a vertical cross-sectional view of the first exemplary structure after planarization of the MTJ-level dielectric material layer according to the first embodiment of the present disclosure.

Referring to FIG. 6, a planarization process can be performed to remove the two-dimensional array of mask patterns (41, 43, 45) and portions of the MTJ-level dielectric material layer 604 that overlie a horizontal plane including the top surfaces of the MTJ-containing pillar structure 20, i.e., the horizontal plane including the top surfaces of the nonmagnetic coupling layers 29. The planarization process may comprise a chemical mechanical polishing (CMP) process in which the nonmagnetic coupling layers 29 are employed as stopping structures. Thus, the top surface of the MTJ-level dielectric material layer 604 after the planarization process may be coplanar with the top surfaces of the nonmagnetic coupling layers 29.

Figure 7:
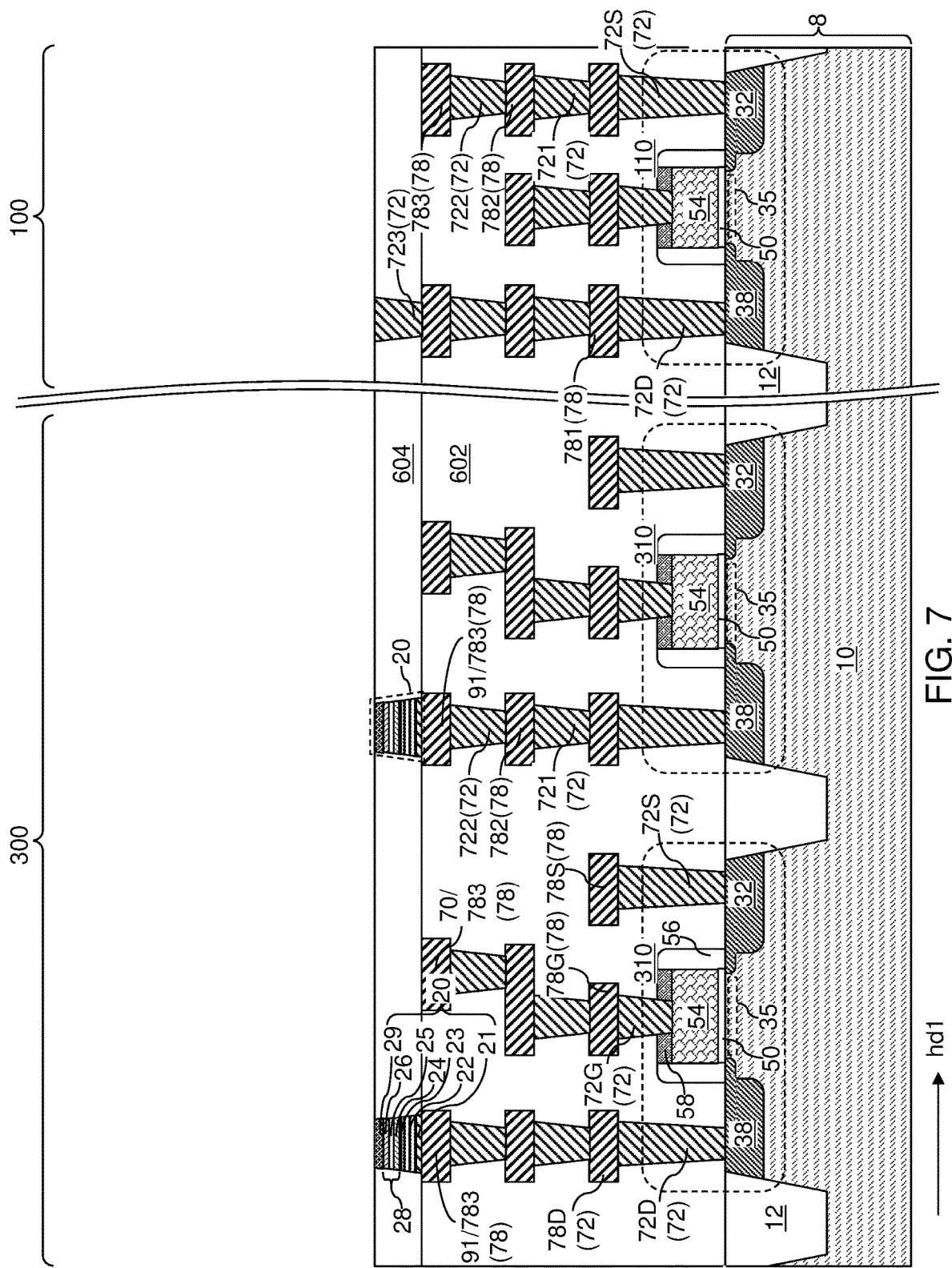
FIG. 7 is a vertical cross-sectional view of the first exemplary structure after formation of MTJ-level via structures according to the first embodiment of the present disclosure.

Referring to FIG. 7, via cavities can be formed through the MTJ-level dielectric material layer 604 in the peripheral region 100 over areas of a subset of the third-line-level metal lines 783. At least one metallic material can be deposited in the via cavities, and excess portions of the at least one metallic material can be removed from above the horizontal plane including the top surface of the MTJ-level dielectric material layer 604 by a planarization process. Remaining portions of the at least one metallic material filling the via cavities constitute metal via structures, which are herein referred to as third-via-level metal via structures 723, which are also referred to as MTJ-level via structures.

It should also be noted that the order of operations may be altered. As an example, a metal layer may be deposited over the lower-level dielectric material layers 602 and patterned (e.g., etched) to form the metal via 723 prior to the formation of the MTJ-level dielectric material layer 604.

Figure 8:
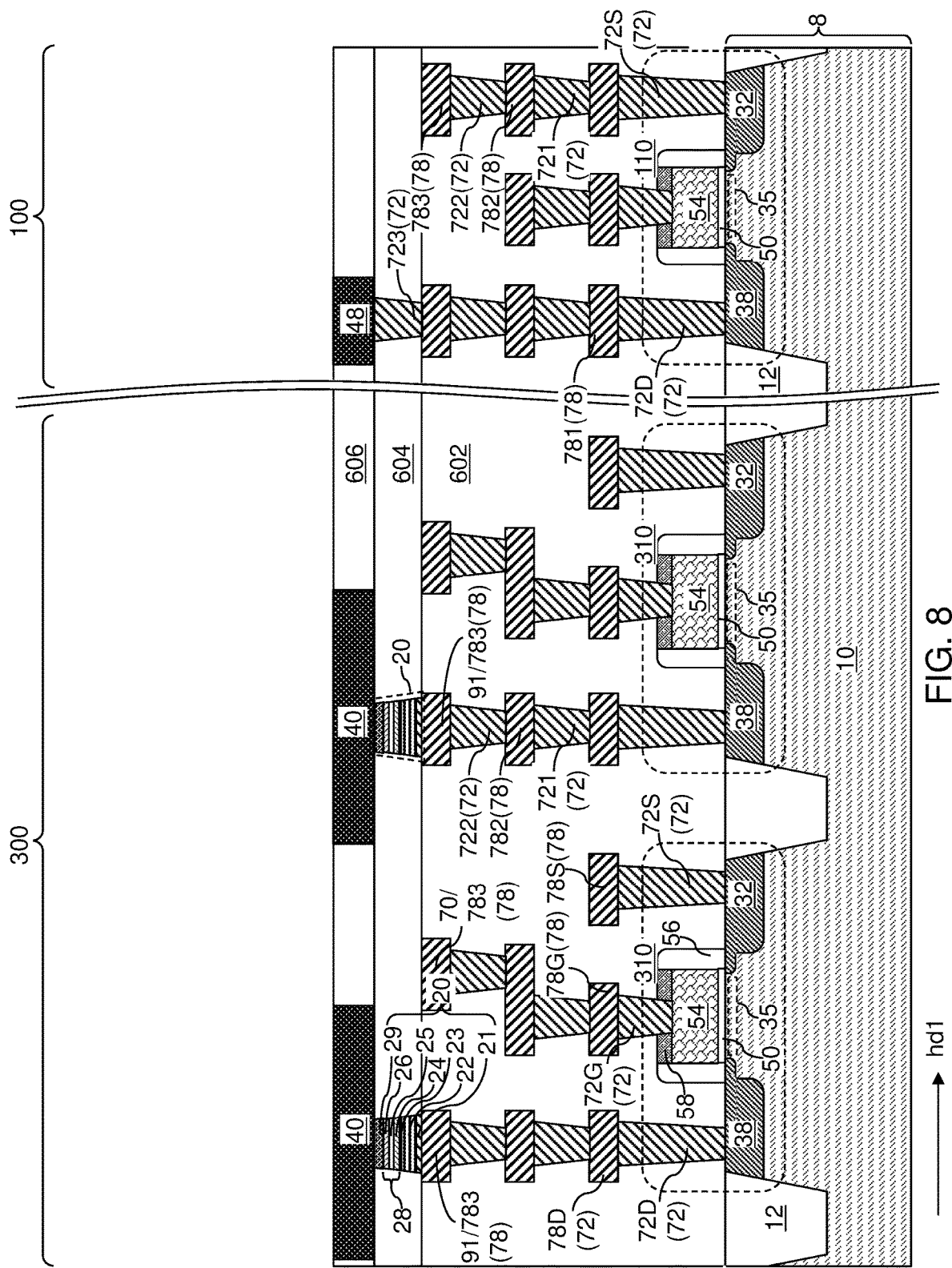
FIG. 8 is a vertical cross-sectional view of the first exemplary structure after formation of spin current metal lines and metal lines according to the first embodiment of the present disclosure.

Referring to FIG. 8, a SOT layer is deposited over the two-dimensional array of MTJ-containing pillar structures 20. The SOT layer may comprise at least one second metal or metal alloy having large spin-orbit coupling strength, such as Pt, Ta, W, Hf, Ir, CuBi, CuIr, AuPt, AuW, PtPd, etc. In one embodiment, the SOT layer may comprise an elemental metal having an atomic number in a range from 72 to 79 (e.g., Pt, Ta, W, Hf or Ir) at a total atomic percentage greater than 90%, and/or greater than 99%, and/or greater than 99.9%. Alternatively the SOT layer may comprise of an alloy of two or more metals having an atomic number between 72 and 79, or an alloy of at least one metal having an atomic number between 72 and 79 and second material not having an atomic number between 72 and 79 where said second material has an atomic percentage less than 50%. The SOT layer may be deposited by physical vapor deposition or chemical vapor deposition. The thickness of the SOT layer may be in a range from 5 nm to 25 nm, although lesser and greater thicknesses may also be employed.

A photoresist layer (not shown) can be applied over the heavy metal SOT layer, and can be lithographically patterned into discrete photoresist material portions. The discrete photoresist material portions may comprise a two-dimensional periodic array line-shaped photoresist material portions that are formed in the memory array region 300, and additional discrete photoresist material portions that are formed in the peripheral region 100. An anisotropic etch process can be performed to remove portions of the heavy metal SOT layer that are not masked by the patterned portions of the photoresist layer.

Remaining portions of the heavy metal SOT layer that remains in the memory array region 300 comprise a two-dimensional array of spin current metal lines (e.g., SOT lines) 40. The spin current metal lines 40 are metal lines that may comprise and/or consist essentially of the at least one second metal or metal alloy and elongated along the first horizontal direction hd1. Generally, the spin current metal lines 40 are used to flow a write current that imparts a spin to underlying free layers 26 through the spin Hall effect. In one embodiment, each spin current metal line 40 may comprise a center portion of which a bottom surface is in direct contact with a topmost surface of a respective underlying MTJ-containing pillar structure 20.

The width of each spin current metal line 40 along the second horizontal direction may be a minimum lithographic width (which is typically represented by the letter "F"). The minimum lithographic width refers to the minimum lateral dimension that can be printed employing a lithographic exposure and development process. The length of each spin current metal line 40 along the first horizontal direction hd1 may be in a range from three times the minimum lithographic width to five times the minimum lithographic width, although lesser and greater lengths along the first horizontal direction hd1 may also be employed.

In one embodiment, each spin current metal line 40 includes a center portion that contacts a top surface of a nonmagnetic coupling layer 29 of a respective underlying MTJ-containing pillar structure 20. In one embodiment, the nonmagnetic coupling layers 29 (if present) have a lower electrical resistivity than the spin current metal lines 40 and are thinner than the spin current metal lines 40 to maximize the spin Hall effect on the free layers 26. In one embodiment, the ratio of the thickness of the nonmagnetic coupling layers 29 to the height (i.e., the vertical thickness) of the spin current metal lines 40 may be in a range from 0.005 to 0.2, such as from 0.01 to 0.1, although lesser and greater ratios may also be employed.

In one embodiment, remaining patterned portions of the SOT layer in the peripheral region 100 may comprise metal lines, which are herein referred to as lines 48. The lines 48 have the same material composition and the same thickness as the spin current metal lines 40. The lines 48 may contact a top surface of a respective underlying metal via structure such as a third-via-level metal via structure 723. In one embodiment, the peripheral circuit may comprise a subset of the lines 48 as components of the metal interconnect structures.

A spin-current-level dielectric material layer 606 can be deposited in the gaps between the two-dimensional array of spin current metal lines 40 and the lines 48. The spin-current-level dielectric material layer 606 comprises a dielectric material such as silicon nitride, undoped silicate glass, a doped silicate glass, or organosilicate glass. Excess portions of the dielectric material can be removed from above the horizontal plane including the top surfaces of the spin current metal lines 40 by a planarization process, such as a chemical mechanical polishing process. In this case, the top surface of the spin-current-level dielectric material layer 606 can be formed within the horizontal plane including the top surfaces of the spin current metal lines 40.

In an alternative embodiment, a damascene process may be used in which the spin-current-level dielectric material layer 606 is formed prior to formation of the two-dimensional array of spin current metal lines 40 and the heavy metal lines 48. Line cavities can be formed in the spin-current-level dielectric material layer 606, and can be filled with the at least one second metal by physical vapor deposition or chemical vapor deposition. Excess portions of the at least one second metal can be removed from above the horizontal plane including the top surface of the spin-current-level dielectric material layer 606 by performing a planarization process, such as a chemical mechanical polishing process. Remaining portions of the at least one second metal comprise the two-dimensional array of spin current metal lines 40 and the lines 48.

Figure 9:
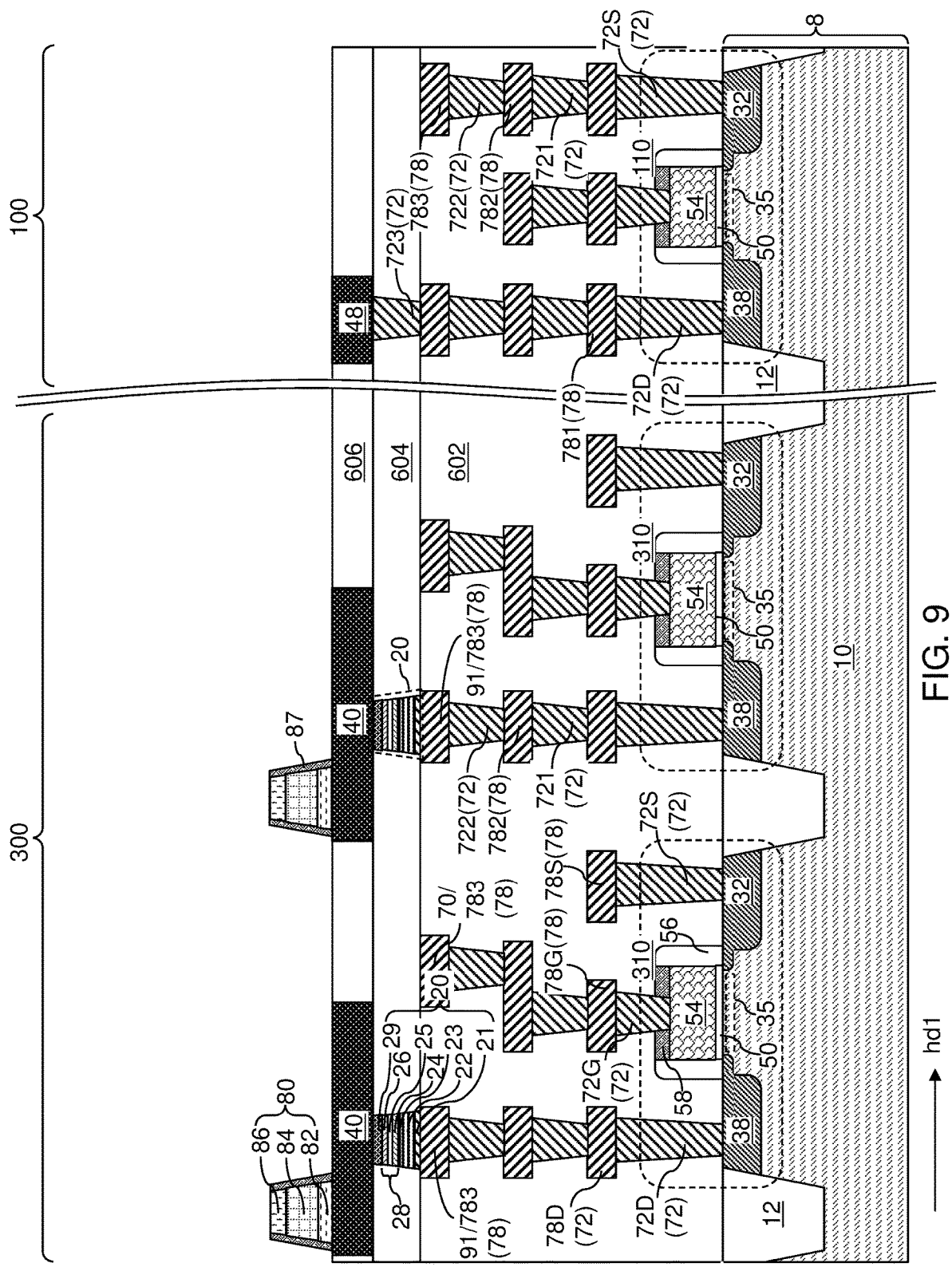
FIG. 9 is a vertical cross-sectional view of the first exemplary structure after formation of selector elements according to the first embodiment of the present disclosure.

Referring to FIG. 9, a two-dimensional array of selector elements 80 can be formed over the two-dimensional array of spin current metal lines 40. For example, a lower selector electrode material layer, a non-Ohmic material layer, and an upper selector electrode material layer can be sequentially deposited over the two-dimensional array of spin current metal lines 40 and the spin-current-level dielectric material layer 606. A photoresist layer (not shown) can be applied over the upper selector electrode material layer, and can be lithographically patterned into a periodic two-dimensional array of photoresist material portions that overlie the two-dimensional array of spin current metal lines 40. Each patterned portion of the photoresist layer can be formed entirely within the area of a respective one of the spin current metal lines 40 in a plan view, such as a top-down view. Specifically, each patterned portion of the photoresist layer may be formed entirely within the area of a first end portion of the respective one of the spin current metal lines 40.

An anisotropic etch process can be performed to remove portions of the upper selector electrode material layer, the non-Ohmic material layer, and the upper selector electrode material layer that are not masked by the patterned portions of the photoresist layer. Each patterned portion of the upper selector electrode material layer comprises an upper selector electrode 86. Each patterned portion of the non-Ohmic material layer comprises a non-Ohmic material portion 84. Each patterned portion of the lower selector electrode material layer comprises a lower selector electrode 82.

The lower selector electrodes 82 and the upper selector electrodes 86 may comprise a respective a non-metallic conductive material. Exemplary non-metallic conductive materials that can be employed for the lower selector electrodes 82 and the upper selector electrodes 86 include amorphous carbon, amorphous boron-doped carbon, amorphous metal-doped carbon, amorphous nitrogen-doped carbon, and layer stacks thereof. The non-Ohmic material portions 84 provide non-Ohmic resistive characteristics as a function of an applied electrical voltage thereacross. For example, the non-Ohmic material portion 84 may comprise an ovonic threshold switch material, a conductive bridge material, a diode, or any other non-Ohmic switching material or structure that can switch between different resistivity states above a threshold voltage. For example, the ovonic threshold switch material can be a chalcogenide compound, such as a telluride compound, a selenide compound, a sulfide compound, a selenide-sulfide compound, a silicon-telluride compound, a silicon-selenide compound, a selenide-telluride compound, or a sulfide-selenide-telluride compound. Exemplary ovonic threshold switch materials include, but are not limited to zinc telluride compounds (such as $Zn_{1-x}Te_x$), germanium telluride compounds, germanium selenide compounds doped with a dopant selected from As, N, and C, such as a Ge—Se—As. In one embodiment, the ovonic threshold switch material layer can include, and/or can consist essentially of, GeS alloy, a SiS alloy, a GeSeAs alloy, a ZnTe alloy, a GeSe alloy, a SeAs alloy, a GeTe alloy, a SiTe alloy, or comprise of combinations thereof. Each contiguous stack of a lower selector electrode 82, a non-Ohmic material portion 84, and an upper selector electrode 86 constitutes a selector element 80.

Each selector element 80 can be formed directly on and can be electrically connected to the top surface of a first end of a respective spin current metal line 40. Thus, each selector element 80 can contact a first segment of the top surface of the respective spin current metal line 40. In one embodiment, the selector element 80 comprises a two-terminal selector element including a non-Ohmic material portion 84 that provides non-Ohmic resistive characteristics as a function of an applied electrical voltage thereacross. In one embodiment, each non-Ohmic material portion 84 comprises an ovonic threshold switch material.

Each selector element 80 may have a respective tapered sidewall. The taper angle of the tapered sidewalls of the selector elements 80, as measured relative to the vertical direction, may be in a range from −5 degree to 20 degrees, such as a preferred 0 degrees, although lesser and greater taper angles may also be employed. The selector element 80 may be offset along the first horizontal direction hd1 from the respective underlying MTJ-containing pillar structure 20 that contacts the same spin current metal line 40 as the selector element 80. The selector element 80 contacts the top surface of the respective spin current metal line 40 and the MTJ-containing pillar structure 20 contacts the bottom surface of the same spin current metal line 40. Thus, the selector element 80 and the respective MTJ-containing pillar structure 20 are located on opposite vertical sides of the respective spin current metal line 40 and are laterally offset from each other along the first horizontal direction hd1.

Optionally, dielectric selector spacers 87 may be formed around the selector elements 80, for example, by depositing and anisotropically etching a conformal passivation dielectric material layer. The dielectric selector spacers 87 may comprise a passivation dielectric material such as silicon nitride or silicon carbonitride. The lateral thickness of the dielectric selector spacers 87 may be in a range from 3 nm to 30 nm, although lesser and greater thicknesses may also be employed.

Figure 10:
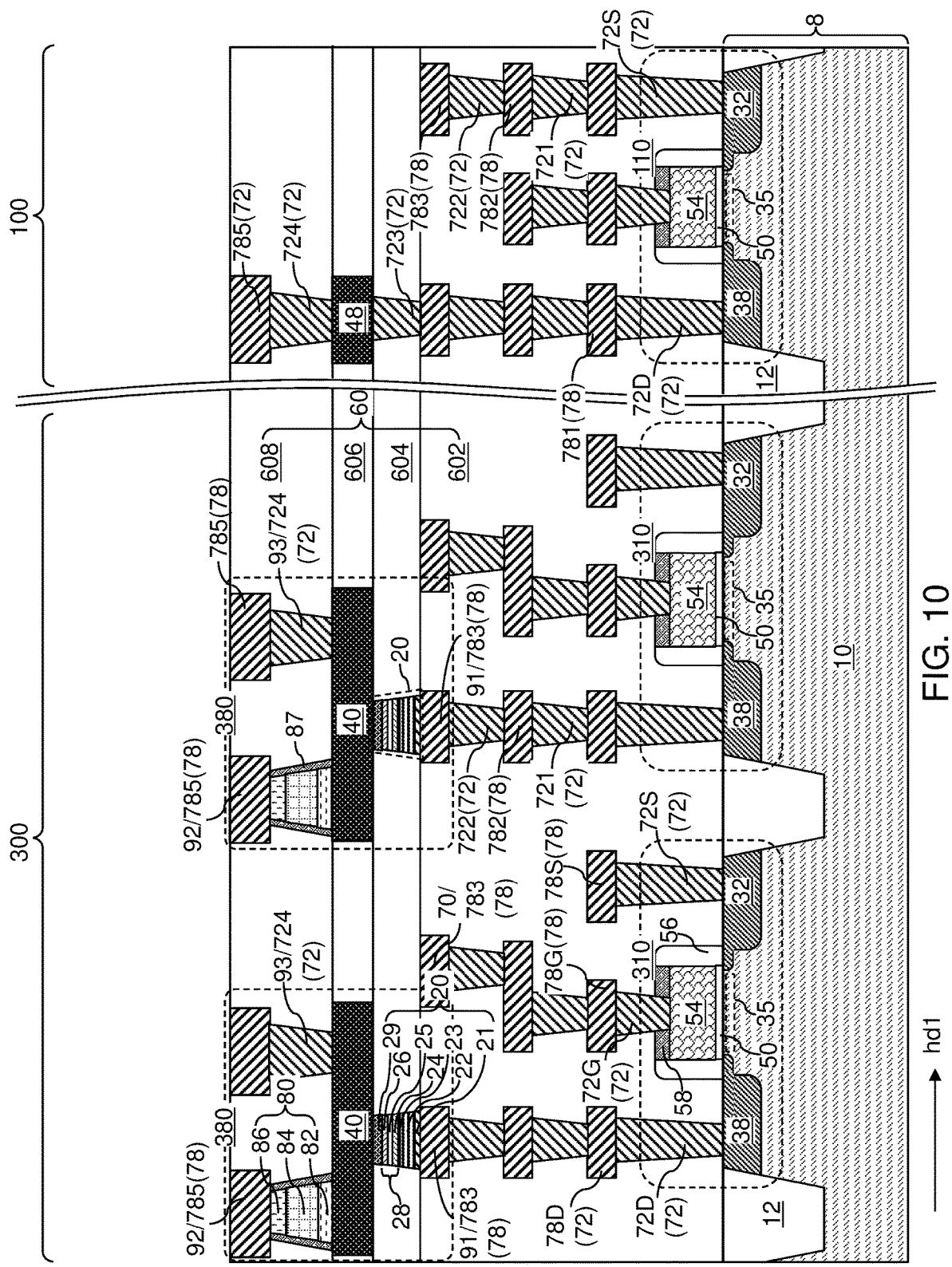
FIG. 10 is a vertical cross-sectional view of the first exemplary structure after formation of a first upper-level dielectric material layer and first upper-level metal interconnect structures according to the first embodiment of the present disclosure.

Referring to FIG. 10, a first upper-level dielectric material layer 608 can be deposited over the two-dimensional array of selector elements 80. Via cavities and line cavities may be formed in the first upper-level dielectric material layer 608, and can be filled with at least one conductive material to form metal via structures and metal lines. The metal via structures are formed in the fourth via level, and are herein referred to as four-via-level metal via structures 724. The metal lines are formed in the fifth line level, and are herein referred to as fifth-line-level metal lines 785. The combination of all dielectric material layers that are formed above the substrate 8 is herein collectively referred to as dielectric material layers 60.

A subset of the fifth-line-level metal lines 785 that is formed on the top surfaces of the selector elements 80 comprises second electrodes 92 of spin-orbit-transfer (SOT) memory cells 380. A subset of the fourth-via-level metal via structures 724 that is formed on the second segment of the top surface of a respective spin current metal line 40 constitutes a third electrode 93 of the SOT memory cells 380. Each third electrode 93 can be formed on a second end of the spin current metal line 40 which is laterally offset along the first horizontal direction hd1 from the respective selector element 80 and the MTJ-containing pillar structure 20 that contact the same respective spin current metal line 40. The third electrode 93 and the respective selector element 80 contact the same top surface of the respective spin current metal line 40. A two-dimensional array of SOT memory cells 380 is thus formed over the two-dimensional array of access transistors 310.

However, the formation of metal lines 48 is optional because their purpose is to connect circuits below spin-current-level dielectric material layer 606 with interconnects and wires above spin-current-level dielectric material layer 606. In this configuration, via 724 may be in direct contact with via 723.

A SOT magnetoresistive memory device includes a two-dimensional array of SOT memory cells 380. Each SOT memory cell 380 comprises a first electrode 91, an MTJ-containing pillar structure 20, a spin current metal line 40 located above the MTJ-containing pillar structure 20, a selector element 80 located on a first end of the spin current metal line 40, a second electrode 92 contacting a top surface of the selector element 80, and a third electrode 93 contacting a second end portion of the spin current metal line 40. In one embodiment, the third electrode 93 comprises a metal via structure (such as a fourth-via-level metal via structure 724) contacting a segment of a top surface of the spin current metal line 40.

In one embodiment, the SOT magnetoresistive memory device comprises word lines 30 that are laterally spaced part along a first horizontal direction hd1 and laterally extend along a second horizontal direction. The word lines 30 may include a plurality of second electrodes 92 that are arranged along the second horizontal direction. In this case, each of the word lines comprises 30 a respective row of the second electrodes 92 of the two-dimensional array of SOT memory cells 380.

Figure 11A:
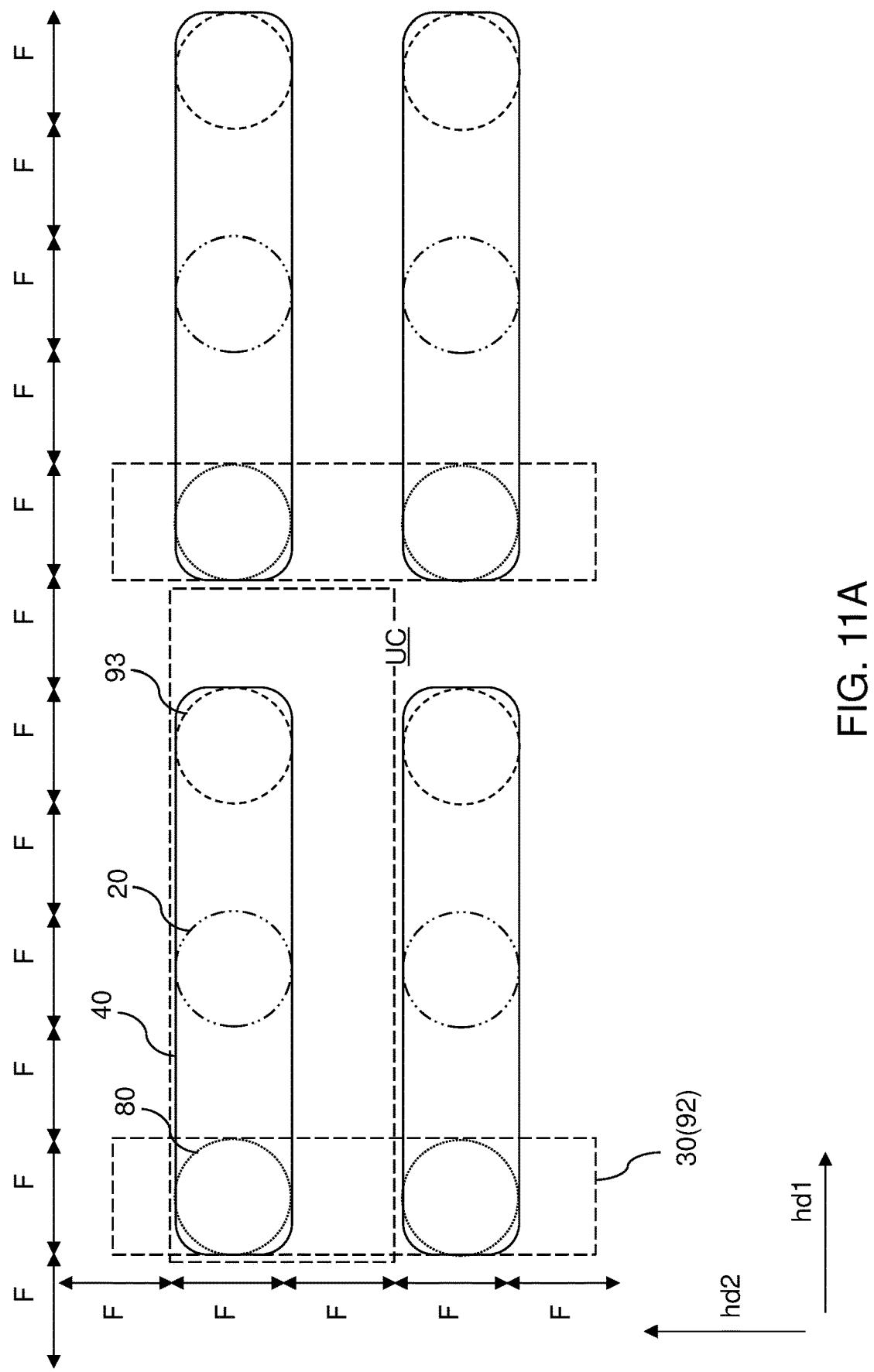
FIG. 11A is a plan view of a first configuration of the first exemplary structure after the processing steps of FIG. 10.
Figure 11B:
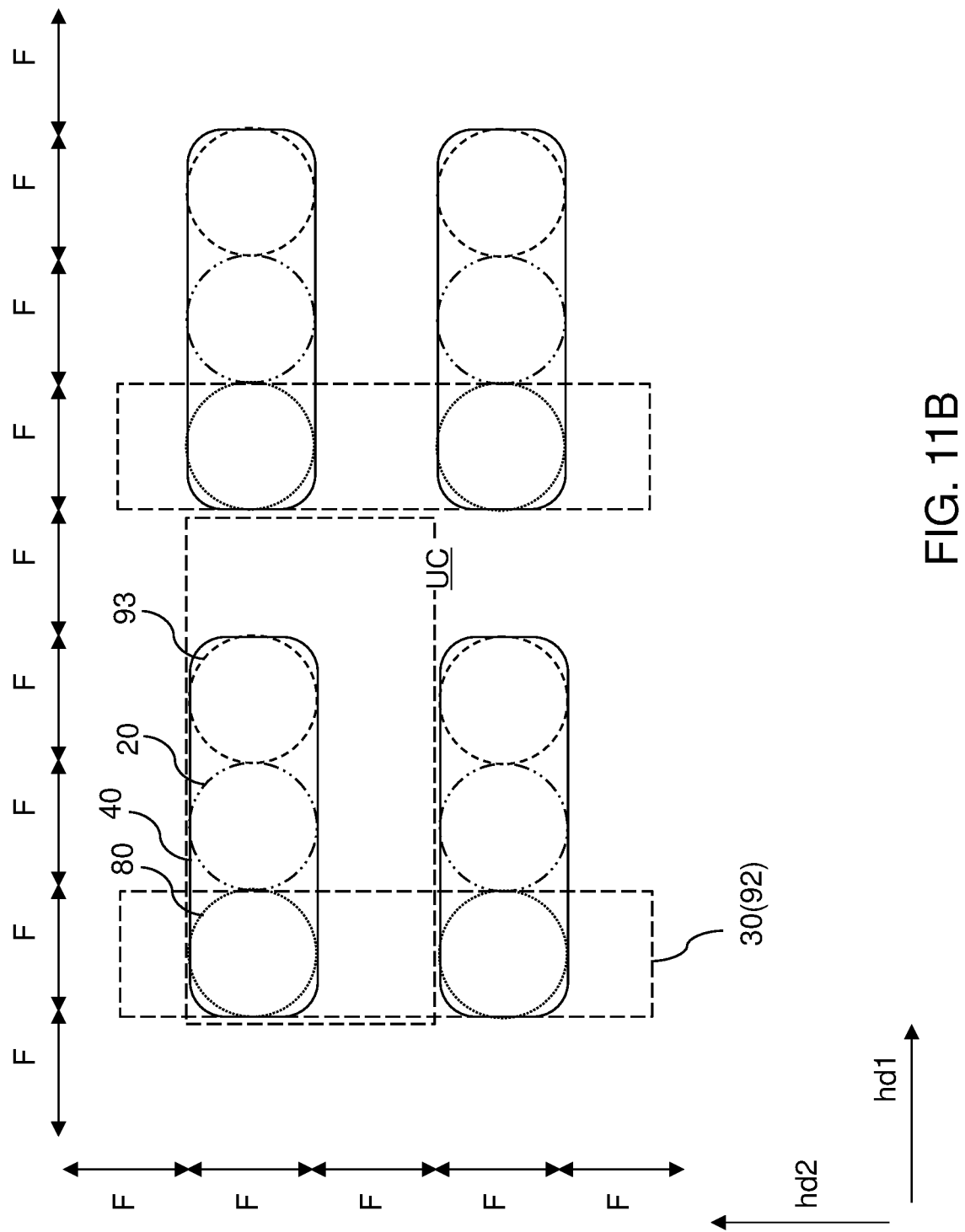
FIG. 11B is a plan view of a second configuration of the first exemplary structure after the processing steps of FIG. 10.

FIG. 11A is a plan view of a first configuration of the first exemplary structure after the processing steps of FIG. 10. FIG. 11B is a plan view of a second configuration of the first exemplary structure after the processing steps of FIG. 10. FIGS. 11A and 11B illustrate exemplary layouts for unit cells UC for the SOT memory array of the present disclosure. The unit cells UC in FIGS. 11A and 11B may comprise the unit cells 580 in the memory device 500 of FIG. 1.

FIG. 11A illustrates a first layout in which each unit cell UC occupies an area corresponding to 12 times the square of a minimum lithographic width F (i.e., the first layout has a $12F^2$ design). Specifically, the unit cell in FIG. 11A has a lateral dimension of 6F along the first horizontal direction hd1 (which is the lengthwise direction of a spin current metal line 40) and a lateral dimension of 2F along the second horizontal direction hd2, which is perpendicular to the first horizontal direction hd1. Word lines 30 may continuously extend along the second horizontal direction hd2. Each word line 30 may include a respective row of second electrodes 92 that are merged together along the second horizontal direction hd2. Within each unit cell UC, the second electrode 92 may be laterally offset from the MTJ-containing pillar structure 20 by about 1F in a plan view, and the third electrode 93 may be laterally offset from the MTJ-containing pillar structure 20 by about 1F in the plan view.

FIG. 11B illustrates a second layout in which each unit cell UC occupies an area corresponding to 8 times the square of a minimum lithographic width F (i.e., the second layout has a $8F^2$ design). Specifically, the unit cell in FIG. 11B has a lateral dimension of 4F along the first horizontal direction hd1 (which is the lengthwise direction of a spin current metal line 40) and a lateral dimension of 2F along the second horizontal direction hd2, which is perpendicular to the first horizontal direction hd1. Word lines 30 may continuously extend along the second horizontal direction hd2. Each word line 30 may include a respective row of second electrodes 92 that are merged together along the second horizontal direction hd2. Within each unit cell UC, the second electrode 92 may border the MTJ-containing pillar structure 20 in a plan view, and the third electrode 93 may border the MTJ-containing pillar structure 20 in the plan view.

Figure 12:
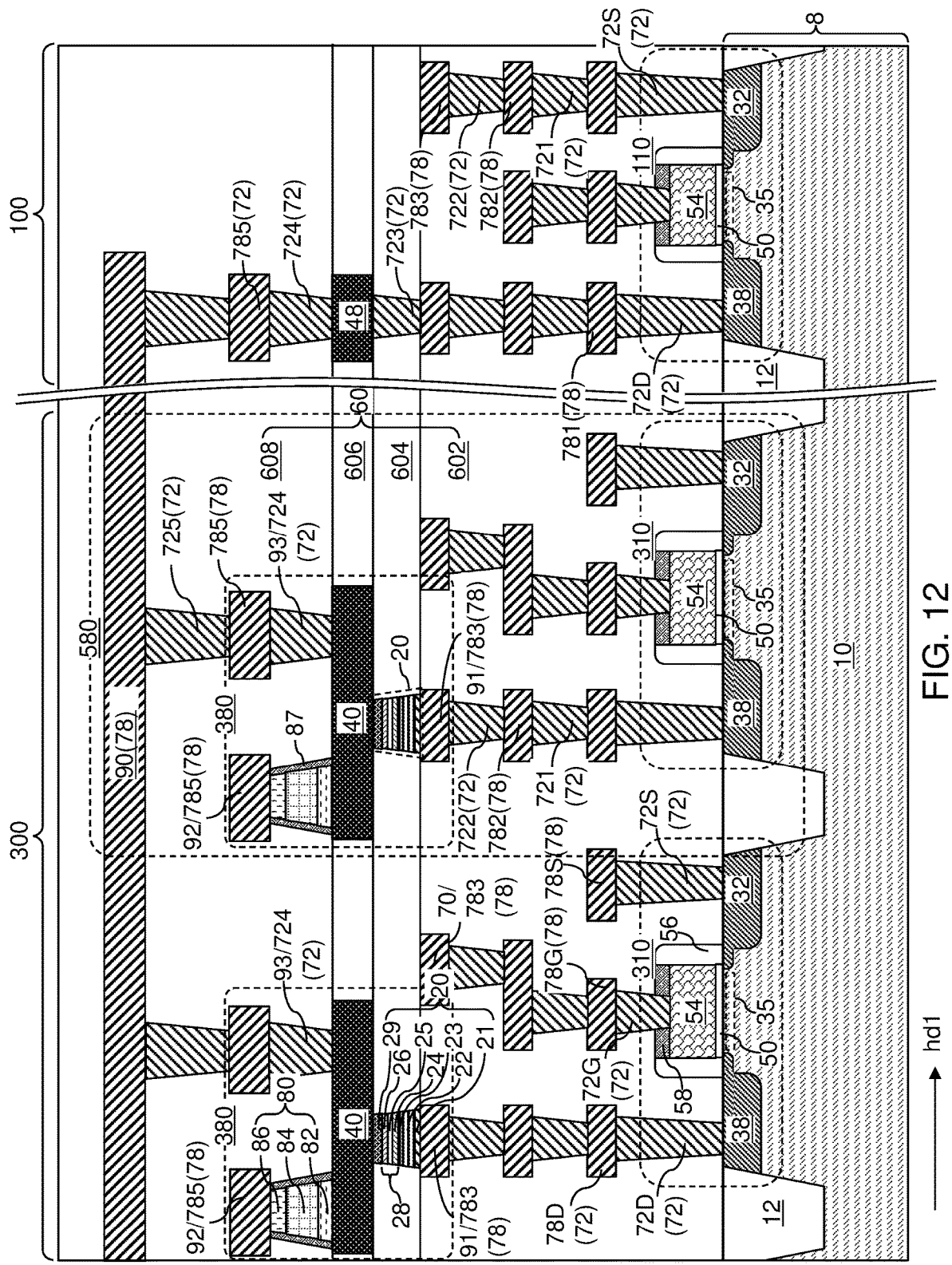
FIG. 12 is a vertical cross-sectional view of the first exemplary structure after formation of additional upper-level dielectric material layers and additional upper-level metal interconnect structures according to the first embodiment of the present disclosure.

Referring to FIG. 12, additional upper-level dielectric material layers 608 can be formed above the first upper-level dielectric material layer 608. Additional upper-level metal interconnect structures (725, 90) may be formed in the additional upper-level metal interconnect structures (725, 90). The additional upper-level metal interconnect structures (725, 90) may comprise metal via structures 72 such as fifth-via-level metal via structures 725 contacting top surfaces of the fifth-line-level metal lines 785, and metal lines 78 such as bit lines 90. Each bit line 90 may laterally extend along the first horizontal direction hd1 and may be laterally spaced part along the second horizontal direction hd2. Each of the bit lines 90 can be electrically connected to a respective column of the third electrodes 93 of the two-dimensional array of SOT memory cells 380. Each bit line 90 may be electrically connected to a respective device in the peripheral circuit, such as a respective sense amplifier and bit line driver. Each unit cell 580 includes a respective SOT memory cell 380, a fifth-via-level metal via structure 725, and a portion of the bit line 90.

In an alternative embodiment, the orthogonal metal line 78 may constitute a word line 30. When the metal line 78 is the word line 30, it may connect to a peripheral circuit, such as a respective sense amplifier and bit line driver. Also, the word line 30 and the bit line 90 may both attach to separate external circuitry to allow for read and write operations.

Figure 13:
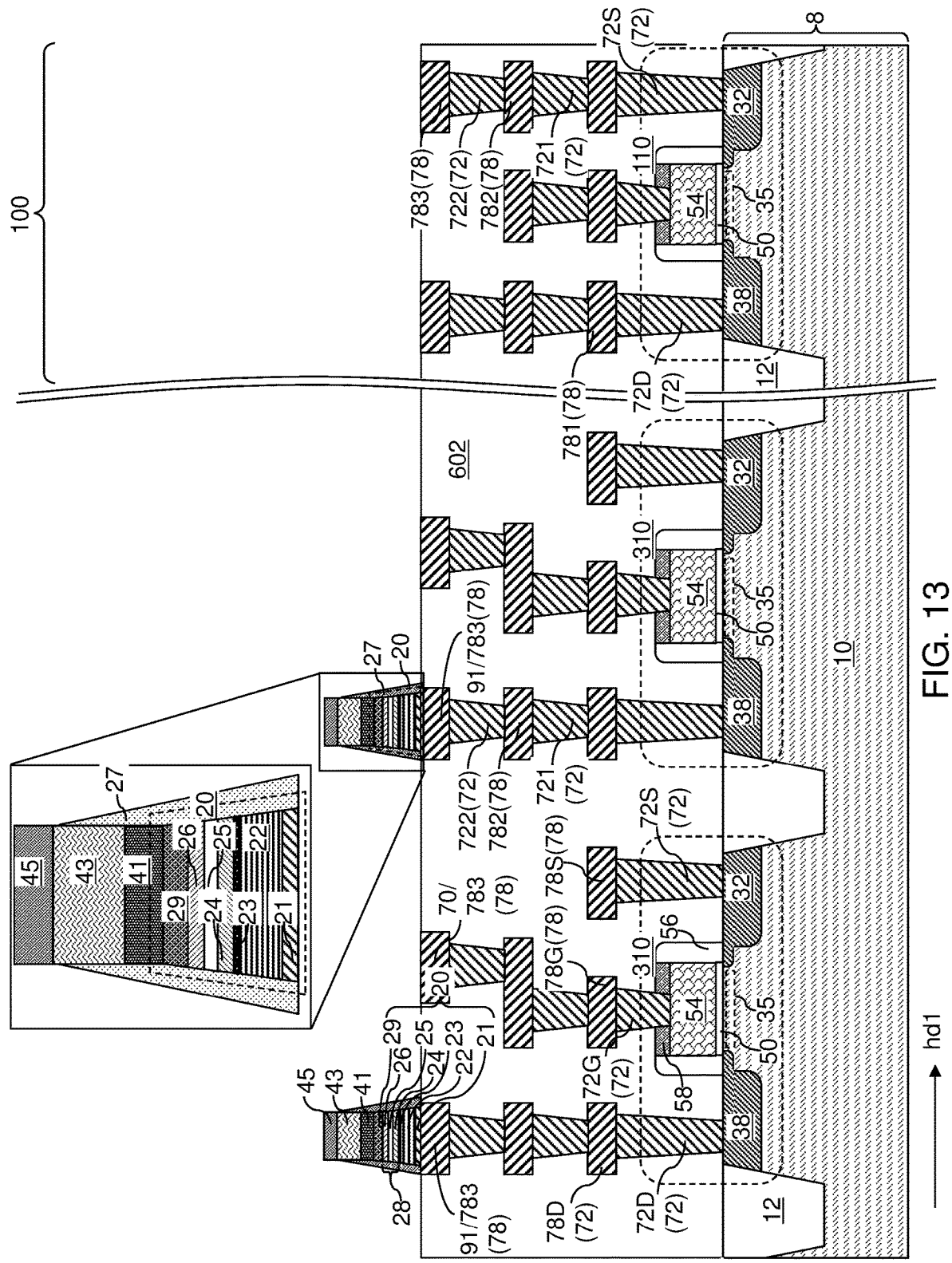
FIG. 13 is a vertical cross-sectional view of an alternative configuration of the first exemplary structure after formation of passivation dielectric spacers around the MTJ-containing pillar structures according to the first embodiment of the present disclosure.

Referring to FIG. 13, an alternative configuration of the first exemplary structure can be derived from the first exemplary structure illustrated in FIG. 4 by forming passivation dielectric spacers 27 around the MTJ-containing pillar structures 20. For example, a passivation dielectric material layer can be conformally deposited around and over the two-dimensional array of MTJ-containing pillar structures 20, and an anisotropic etch process can be performed to remove horizontally-extending portions of the passivation dielectric spacer 27. Remaining tubular portions of the passivation dielectric material layer comprise a two-dimensional array of passivation dielectric spacers 27. The passivation dielectric spacers 27 comprise a passivation dielectric material such as silicon nitride or silicon carbonitride.

Figure 14:
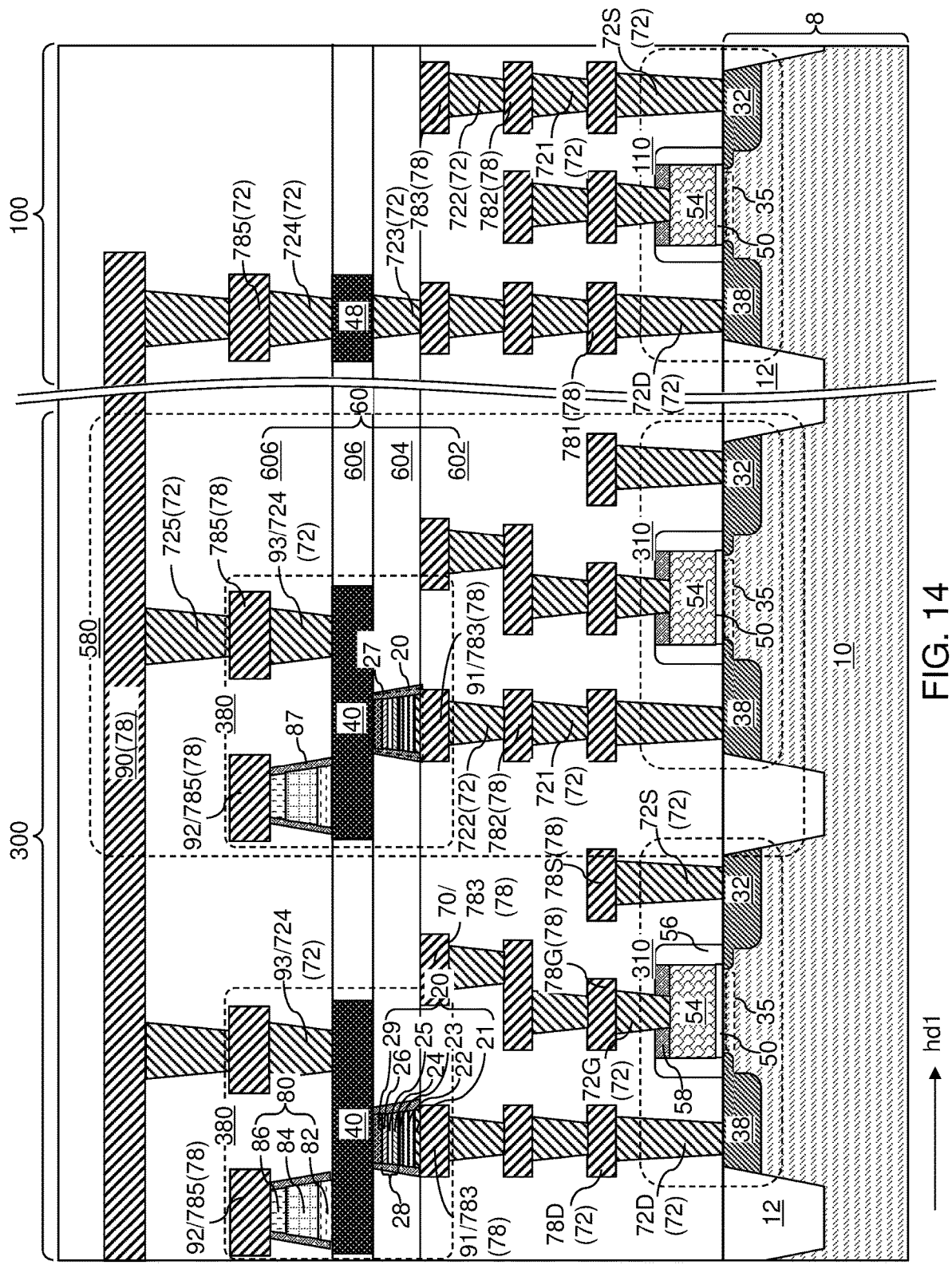
FIG. 14 is a vertical cross-sectional view of the alternative configuration of the first exemplary structure after formation of additional upper-level dielectric material layers and additional upper-level metal interconnect structures according to the first embodiment of the present disclosure.

Referring to FIG. 14, the alternative configuration of the first exemplary structure is illustrated after performing the processing steps described with reference to FIGS. 5-10 and 12.

Figure 15:
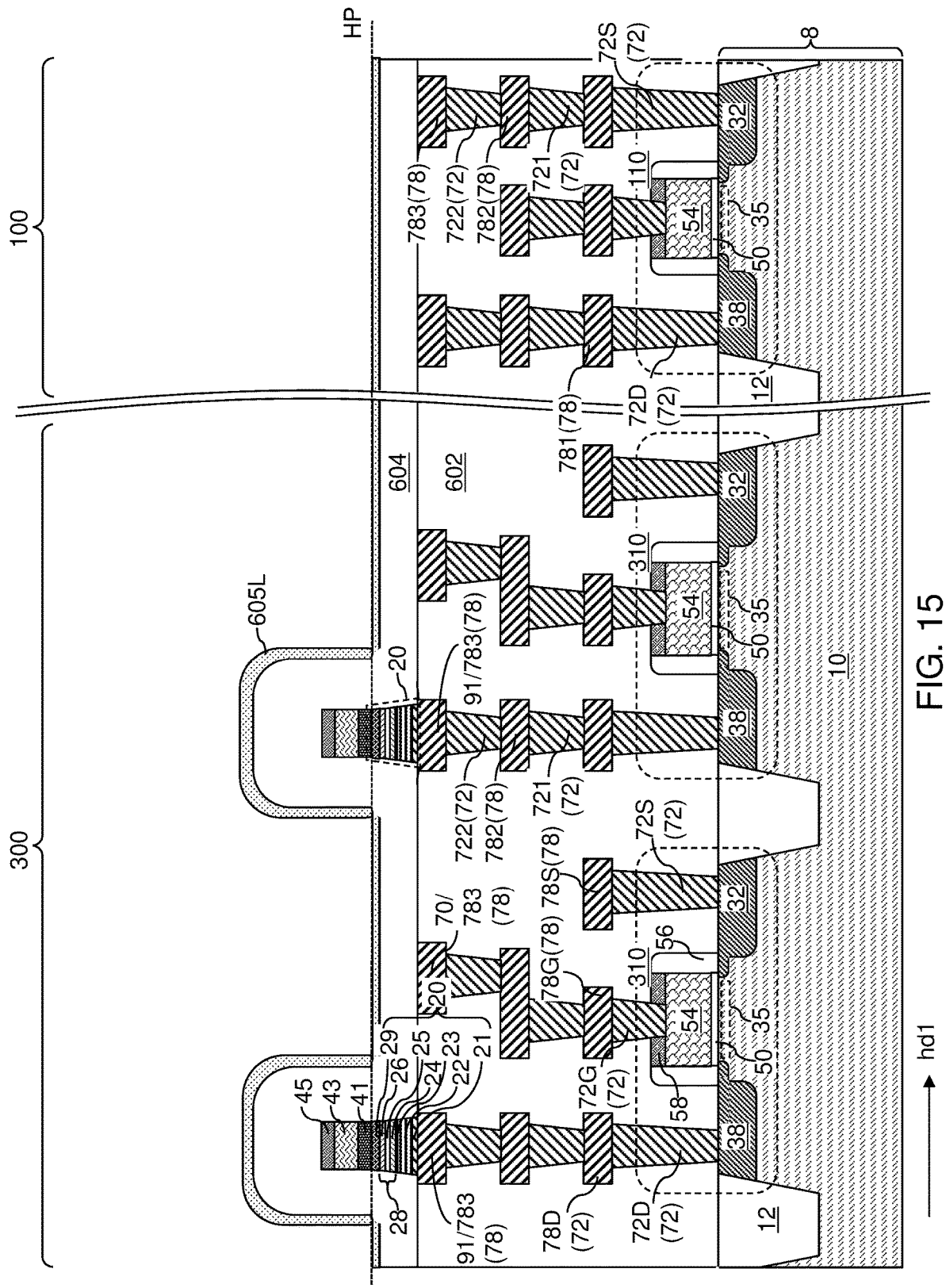
FIG. 15 is a vertical cross-sectional view of a second exemplary structure after vertically recessing the MTJ-level dielectric material layer according to a second embodiment of the present disclosure.

Referring to FIG. 15, a second exemplary structure according to a second embodiment of the present disclosure can be derived from the first exemplary structure illustrated in FIG. 5 by measuring the height of the MTJ-containing pillar structures 20 and the overlying mask patterns (41, 43, 45), followed by depositing the MTJ-level dielectric material layer 604 to thickness which is less than a thickness of the MTJ-containing pillar structures 20.

A stress-generating dielectric material layer 605L is then deposited on MTJ-level dielectric material layer 604, including over the protrusions in the MTJ-level dielectric material layer 604 overlying the mask patterns (41, 43, 45). The stress-generating dielectric material layer 605L comprises a dielectric material that can apply compressive lateral stress to the overlying spin current metal lines 40 to be formed in a subsequent step to increase the spin Hall effect during operation of the SOT memory cells 380 to be subsequently formed. In one embodiment, the stress-generating dielectric material may comprise a carbon-based material including carbon at an atomic concentration greater than 90%. In one embodiment, the stress-generating dielectric layer 605L consists essentially of diamond-like carbon (DLC). The thickness of the combination of the stress-generating dielectric material layer 605L and the MTJ-level dielectric material layer 604 is less than or equal to the height of the MTJ-containing pillar structures 20, such that the top surface of the horizontal portion of the stress-generating dielectric material layer 605L located between the MTJ-containing pillar structures 20 is located at or below a horizontal plane HP including the top surfaces of the MTJ-containing pillar structures 20.

Figure 16:
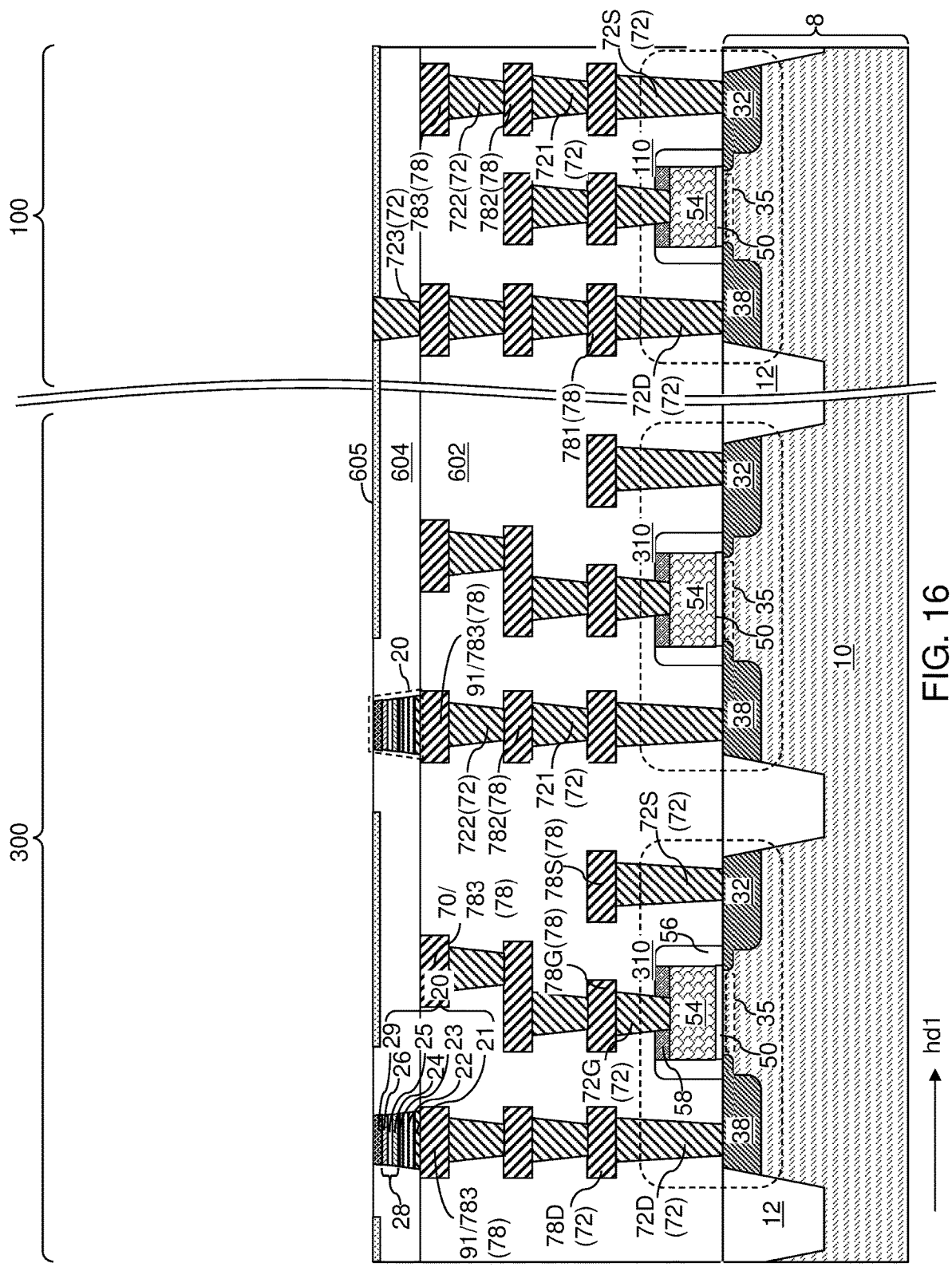
FIG. 16 is a vertical cross-sectional view of the second exemplary structure after deposition and planarization of a stress-generating dielectric liner according to the second embodiment of the present disclosure.

Referring to FIG. 16, the planarization step described above with respect to FIG. 6 is performed. The planarization step may comprise a chemical mechanical polishing step. The horizontal portions of the stress-generating dielectric material layer 605L functions as a polish stop layer during the chemical mechanical polishing step. Excess portions of the stress-generating dielectric material layer 605L located above the horizontal plane HP including the top surfaces of the MTJ-containing pillar structures 20 are removed. The remaining horizontal portions of the stress-generating dielectric material layer 605L that remain below the horizontal plane HP including the top surfaces of the MTJ-containing pillar structures 20 comprise a stress-generating dielectric liner 605.

The stress-generating dielectric liner 605 is formed on the top surface of the remaining portions of the MTJ-level dielectric material layer 604. The bottom surface of the stress-generating dielectric liner 605 can be located above the horizontal plane including the bottom surfaces of the free layers 26, and may be located above the horizontal plane including the top surfaces of the free layers 26. The third-line-level metal via structures 723 vertically extend through the stress-generating dielectric liner 605 and the MTJ-level dielectric material layer 604, and may have a respective top surface that is formed within a horizontal plane including the top surface of the stress-generating dielectric liner 605.

Figure 17:
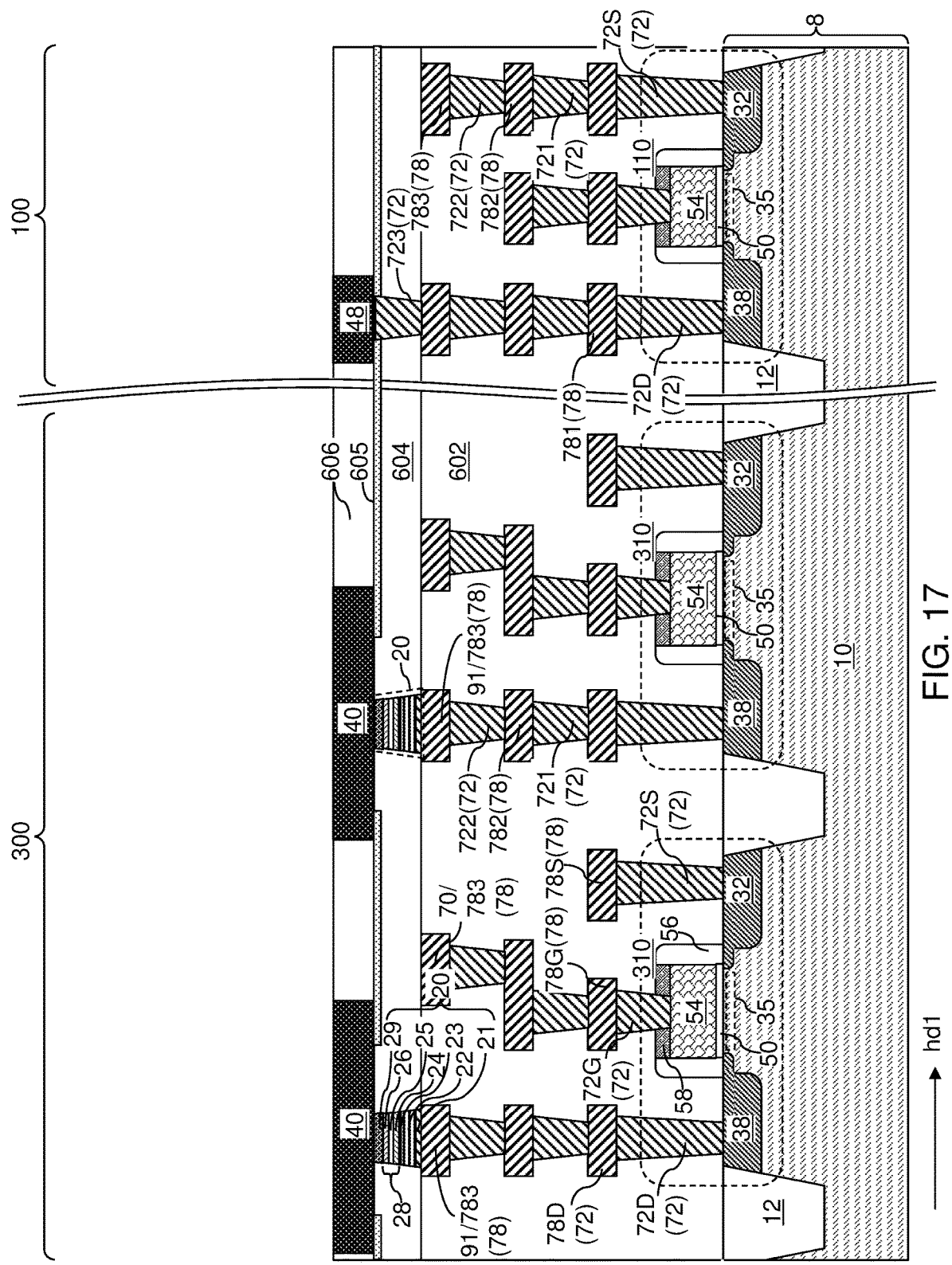
FIG. 17 is a vertical cross-sectional view of the second exemplary structure after formation of spin current metal lines and metal lines according to the second embodiment of the present disclosure.

Referring to FIG. 17, the processing steps described with reference to FIG. 8 can be performed to form a two-dimensional array of spin current metal lines 40 and heavy metal lines 48 over the stress-generating dielectric liner 605. The stress-generating dielectric liner 605 applies stress to the spin current metal lines 40.

A spin-current-level dielectric material layer 606 can be subsequently formed around the two-dimensional array of spin current metal lines 40. Alternatively, the spin-current-level dielectric material layer 606 can be deposited over the two-dimensional array of MTJ-containing pillar structures 20, and line cavities can be formed in the spin-current-level dielectric material layer 606. The two-dimensional array of spin current metal lines 40 and the heavy metal lines 48 can be formed by depositing and planarizing the at least one second metal.

Figure 18:
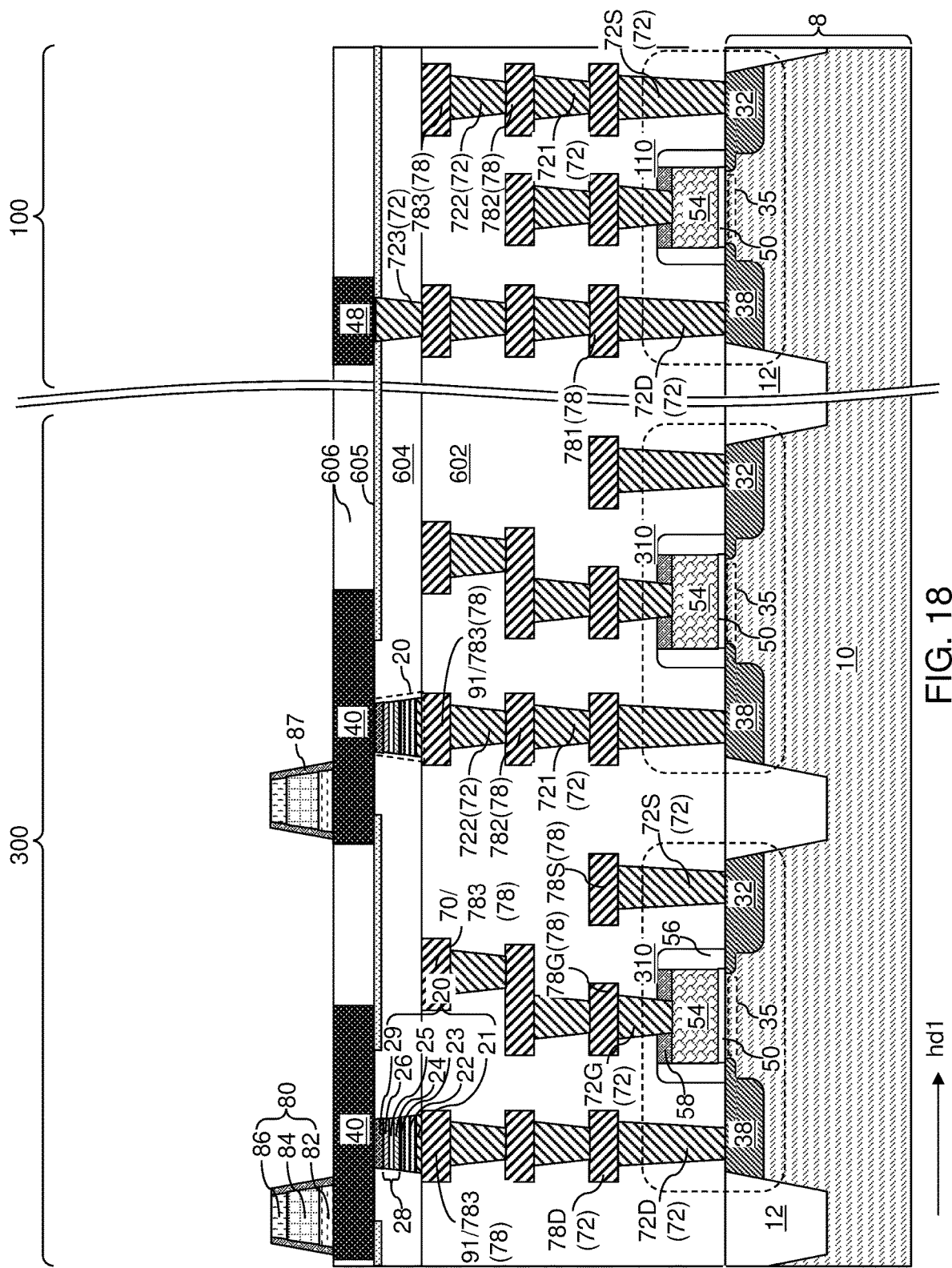
FIG. 18 is a vertical cross-sectional view of the second exemplary structure after formation of selector elements according to the second embodiment of the present disclosure.

Referring to FIG. 18, the processing steps described with reference to FIG. 9 can be performed to form a two-dimensional array of selector elements 80. Dielectric selector spacers 87 may be optionally formed around the selector elements 80. Each selector element 80 can be formed on a surface of a first end of a respective spin current metal line 40, and can be electrically connected to a first end of the respective spin current metal line 40.

Figure 19:
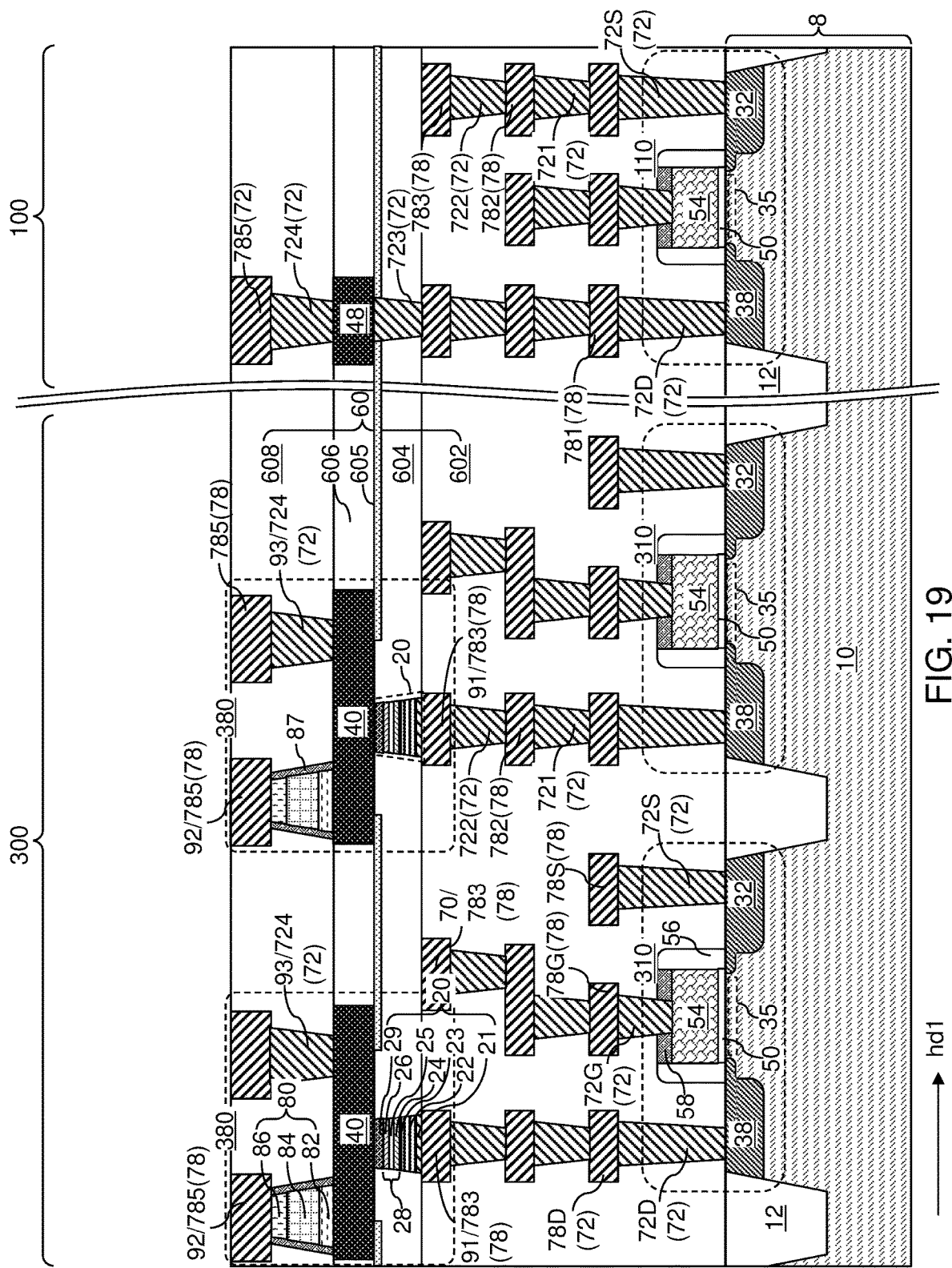
FIG. 19 is a vertical cross-sectional view of the second exemplary structure after formation of a first upper-level dielectric material layer and first upper-level metal interconnect structures according to the second embodiment of the present disclosure.

Referring to FIG. 19, the processing steps described with reference to FIG. 10 can be performed to form first upper-level dielectric material layer 608 and first upper-level metal interconnect structures (785, 724). Generally, a second electrode 92 can be formed a top surface of each selector element 80, and a third electrode 93 embodied as a metal via structure (such as fourth-via-level metal via structures 724) can be formed directly on a segment of a top surface of each spin current metal line 40.

Figure 20:
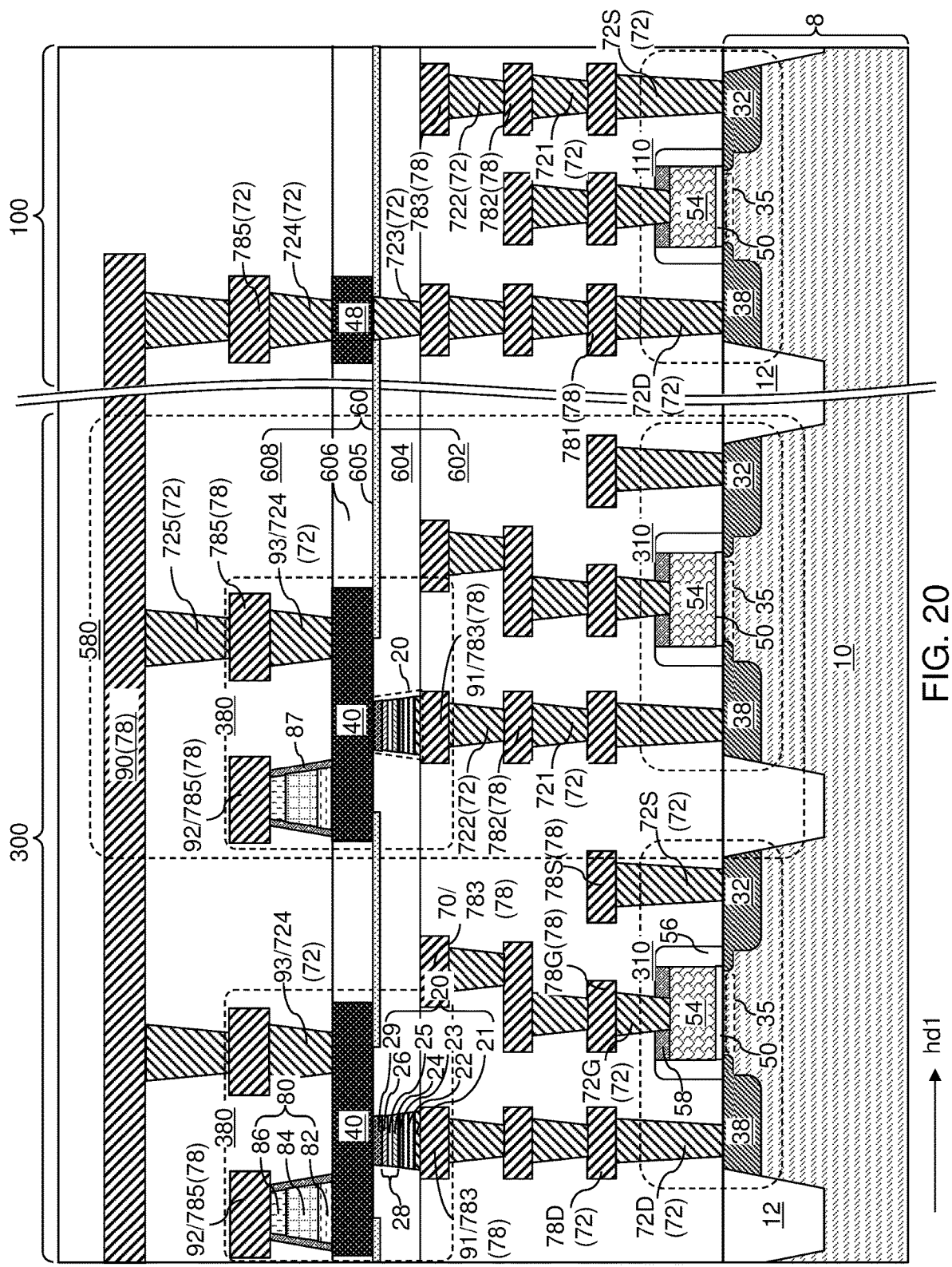
FIG. 20 is a vertical cross-sectional view of the second exemplary structure after formation of additional upper-level dielectric material layers and additional upper-level metal interconnect structures according to the second embodiment of the present disclosure.

Referring to FIG. 20, the processing steps described with reference to FIG. 12 can be performed to form additional upper-level dielectric material layers 608 and additional upper-level metal interconnect structures (78, 72).

Figure 21:
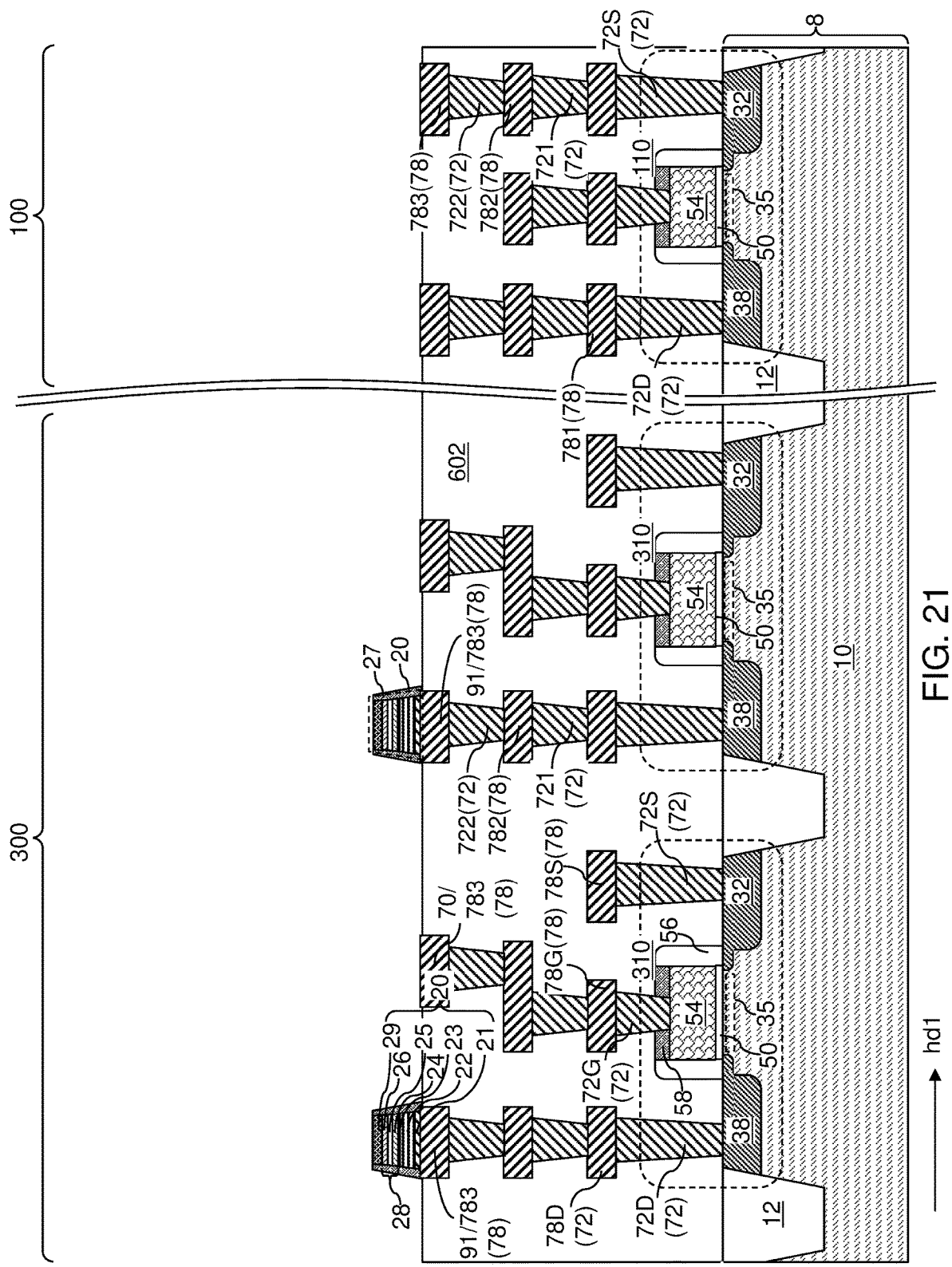
FIG. 21 is a vertical cross-sectional view of an alternative configuration of the second exemplary structure after formation of passivation dielectric spacers according to the second embodiment of the present disclosure.

Referring to FIG. 21, an alternative configuration of the second exemplary structure can be derived from the first exemplary structure illustrated in FIG. 4 by forming the above described passivation dielectric spacers 27 around the MTJ-containing pillar structures 20.

Figure 22:
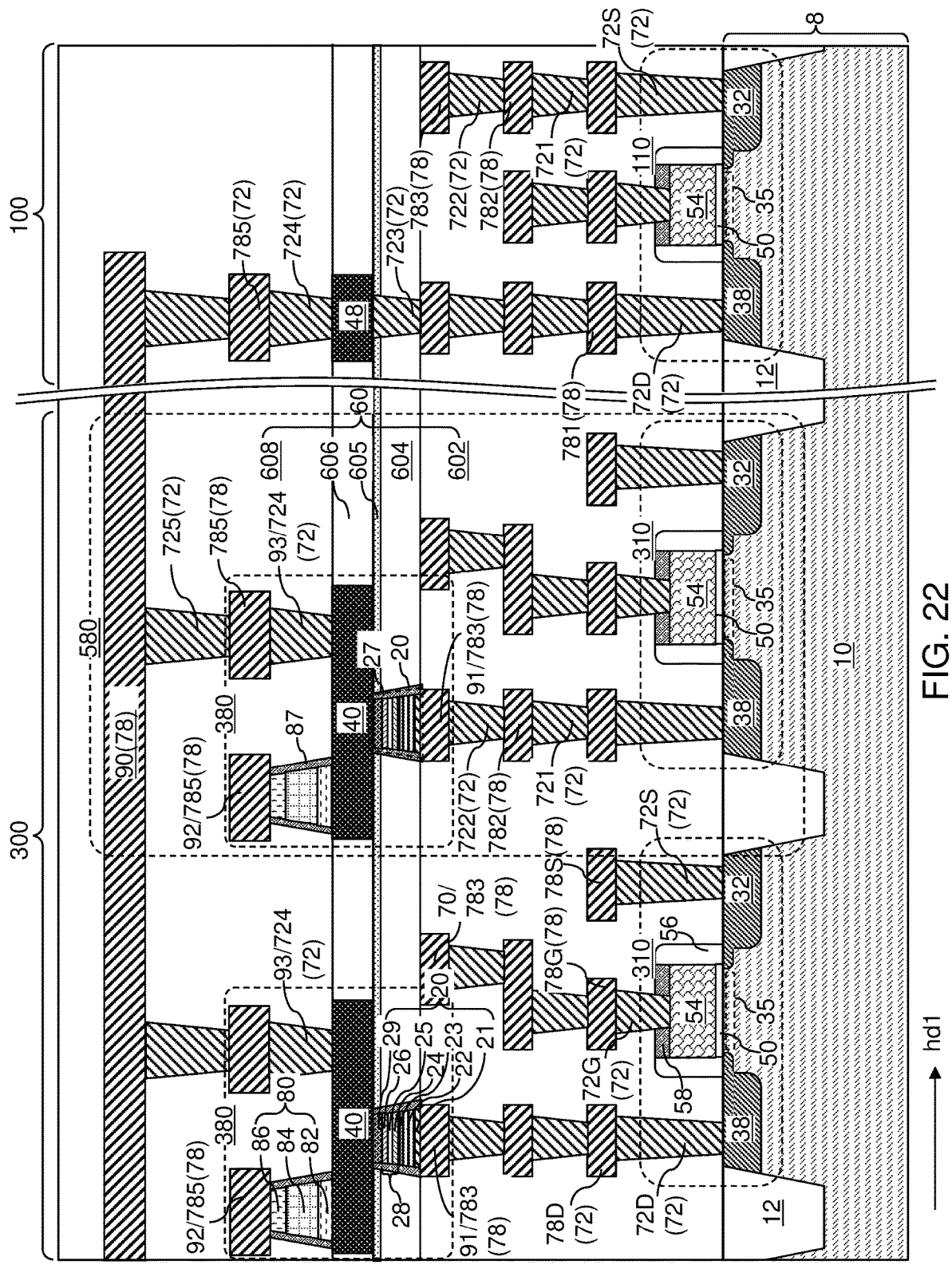
FIG. 22 is a vertical cross-sectional view of the alternative configuration of the second exemplary structure after formation of additional upper-level dielectric material layers and additional upper-level metal interconnect structures according to the second embodiment of the present disclosure.

Referring to FIG. 22, the alternative configuration of the second exemplary structure is illustrated after performing the processing steps described with reference to FIGS. 15-20 to form a two-dimensional array of unit cells 580, which comprises a two-dimensional array of access transistors 310 and a two-dimensional array of SOT memory cells 380.

In another alternative embodiment, the stress generating dielectric liner 605 may be removed after the planarization step shown in FIG. 16. The removal of the dielectric liner 605 can comprise of an oxygen or hydrogen plasma etch process. After the removal of dielectric liner 605, the subsequent spin-current-level dielectric material layer 606 fills the location once occupied by the liner 605. This process defines a stepped (or recessed) interface between the spin-current-level dielectric material layer 606 and MTJ-level dielectric material layer 604 relative to the horizontal plane defined by the top surface of MTJ pillar 20.

Referring collectively to all drawings and according to various embodiments of the present disclosure, a spin-orbit-torque (SOT) magnetoresistive memory device 500 comprising at least one SOT memory cell 380 is provided. Each of the at least one SOT memory cell 380 overlies a substrate 8 and comprises: a first electrode 91 embedded in dielectric material layers 60 overlying the substrate 8; a magnetic-tunnel-junction-containing (MTJ-containing) pillar structure 20 contacting a top surface of the first electrode 91 and comprising a ferromagnetic pinned layer 24, a ferromagnetic free layer 26 that overlies the pinned layer 24, and a tunneling barrier layer located between the free layer and the pinned layer; a spin current metal line 40 including a center portion that overlies and contacts the MTJ-containing pillar structure 20; a selector element 80 that overlies and is electrically connected to a first end of the spin current metal line 40; a third electrode 93 that is electrically connected to a second end of the spin current metal line.

In one embodiment, the selector element 80 contacts a first segment of a top surface of the spin current metal line 40 and is laterally offset from the MTJ containing pillar structure; and the third electrode 93 contacts a second segment of a top surface of the spin current metal line 40 and is laterally offset from the MTJ containing pillar structure 20.

In one embodiment, the selector element 80 comprises a two-terminal selector element including a non-Ohmic material portion 84. In one embodiment, the non-Ohmic material portion 84 comprises an ovonic threshold switch material.

In one embodiment, each of the at least one SOT memory cell 380 comprises a second electrode 92 contacting a top surface of the selector element 80. In one embodiment, the at least one SOT memory cell 380 comprises a two-dimensional array of SOT memory cells 380; the SOT magnetoresistive memory device comprises word lines 30 that are laterally spaced part along a first horizontal direction hd1 and laterally extend along a second horizontal direction hd2; and each of the word lines 30 comprises a respective row of the second electrodes 92 of the two-dimensional array of SOT memory cells 380.

In one embodiment, each of the at least one SOT memory cell 380 comprises a third electrode 93 contacting a second end portion of the spin current metal line 40. In one embodiment, the third electrode 93 comprises a metal via structure contacting a segment of a top surface of the spin current metal line 40. In one embodiment, the SOT magnetoresistive memory device further comprises bit lines 90 that laterally extend along a first horizontal direction hd1 are laterally spaced part along a second horizontal direction and; and each of the bit lines 90 is electrically connected to a respective column of the third electrodes 93 of the two-dimensional array of SOT memory cells 380.

In one embodiment, the MTJ-containing pillar structure 20 within each of the at least one SOT memory cell 380 further comprises a nonmagnetic coupling layer 29 in direct contact with a top surface of the free layer 26 and comprising at least one first metal having an atomic number in a range from 72 to 79 at a total atomic percentage greater than 90%. In one embodiment, the spin current metal line 40 within each of the at least one SOT memory cell 380 comprises at least one second metal having an atomic number in a range from 72 to 79 at a total atomic percentage greater than 90%. In one embodiment, the nonmagnetic coupling layer 29 is thinner than the spin current metal line 40; and a periphery of a bottom surface of the nonmagnetic coupling layer 29 coincides with a periphery of a top surface of the free layer 26.

In one embodiment, the MTJ-containing pillar structure 20 comprises a pinning structure 22 that underlies and is magnetically coupled to, the pinned layer 24. In one embodiment, the at least one SOT memory cell 380 comprises a two-dimensional array of SOT memory cells 380; the SOT magnetoresistive memory device comprises a peripheral circuit configured to control operation of the two-dimensional array of SOT memory cells 380; and the peripheral circuit comprises a metal line having a same or different material composition and a same or different vertical thickness as the spin current metal lines 40 within the two-dimensional array of SOT memory cells 380. In one embodiment, access transistors 310 are located over the substrate 8 below the respective MTJ-containing pillar structures 20 and electrically connected to the respective first electrodes 91.

In one embodiment, the SOT magnetoresistive memory device has an area footprint less than $12F^2$ or less than $8F^2$ where F is a minimum lithographic width.

In one embodiment, the MTJ-containing pillar structure 20 further comprises a nonmagnetic coupling layer 29 in direct contact with a top surface of the free layer 26; and the nonmagnetic coupling layer 29 comprises an antiferromagnet, a synthetic antiferromagnet, a Heusler compound which includes a metal having an atomic number in a range from 25 to 28, or a ferrimagnet.

According to another aspect of the present disclosure, a spin-orbit-torque (SOT) magnetoresistive memory device 500 comprising at least one SOT memory cell 380 is provided. Each of the at least one SOT memory cell 380 overlies a substrate 8 and comprises: a first electrode 91 embedded in dielectric material layers 60 overlying the substrate 8; a magnetic-tunnel-junction-containing (MTJ-containing) pillar structure 20 contacting a top surface of the first electrode 91 and comprising a ferromagnetic pinned layer 24, a ferromagnetic free layer 26 that overlies the pinned layer, a tunneling barrier layer 25 located between the free layer and the pinned layer, and a nonmagnetic coupling layer 29 that overlies the free layer 26; a spin current metal line 50 including a portion (e.g., center portion) that contacts the nonmagnetic coupling layer 29 of the MTJ-containing pillar structure 20; and a second electrode 92 and a third electrode 93 which overlie the MTJ containing pillar structure 20 and which are electrically connected to the spin current metal line 40.

In one embodiment, a bottom periphery of the nonmagnetic coupling layer 29 coincides with a top periphery of the free layer 26.

In one embodiment, an MTJ-level dielectric material layer laterally surrounds the MTJ-containing pillar structure 20; and a stress-generating dielectric liner 605 is located on a top surface of the MTJ-level dielectric material layer and is coplanar with the spin current metal line 40.

In one embodiment, a top surface of the nonmagnetic coupling layer 29 is located within a same horizontal plane as a top surface of the stress-generating dielectric liner 605. In one embodiment, the spin current metal line 40 contacts a top surface of the nonmagnetic coupling layer 29 and the top surface of the stress-generating dielectric liner 605.

In one embodiment, a bottom surface of the stress-generating dielectric liner 605 is located above a horizontal plane including a bottom surface of the free layer 26. In one embodiment, the stress-generating dielectric liner 605 comprises a carbon-based material including carbon at an atomic concentration greater than 90%. In one embodiment, the stress-generating dielectric liner 605 consists essentially of diamond-like carbon (DLC).

In one embodiment, the SOT magnetoresistive memory device comprises a metal via structure vertically extending through the MTJ-level dielectric material layer and the stress-generating dielectric liner 605 and having a top surface located within a horizontal plane including a top surface of the stress-generating dielectric liner 605.

In one embodiment, the SOT magnetoresistive memory device further comprises a passivation dielectric spacer 27 laterally surrounding the MTJ-containing pillar structure 20.

In one embodiment, the SOT magnetoresistive memory device further comprises a selector element 80 that overlies and is electrically connected to a first end of the spin current metal line 40 and is laterally offset from the MTJ containing pillar structure 20.

In one embodiment, the second electrode 92 contacts a top surface of the selector element 80; and the third electrode 93 comprises a metal via structure contacting a segment of a top surface of the spin current metal line 40, and the third electrode 93 is laterally offset from the MTJ containing pillar 20.

In various embodiments, a data storage system 501 comprises a plurality of the SOT magnetoresistive memory devices 500. In one embodiment, at least two of the plurality of the SOT magnetoresistive memory devices 500 share a common word line 30 connected to the second electrode 92, and at least two of the plurality of the SOT magnetoresistive memory devices share a common bit line 90 connected to the third electrode 93.

A programming operation can be performed by flowing a programming (i.e., write) current through the spin current metal line 40 and the selector element 80 between the second electrode 92 and the third electrode 93. A sensing operation can be performed by flowing a sensing (i.e., read) current through the MTJ-containing pillar structure 20 and a portion of the spin current metal line 40 between the MTJ-containing pillar structure 20 and the third electrode 93. Since the programming current does not flow through the magnetic tunnel junction structure 28, endurance of the SOT memory cell 380 can be improved relative to STT memory cells. The various embodiments of the present disclosure provide an SOT memory cell 380 in which the spin current metal line 40 overlies the free layer 26 of the magnetic tunnel junction structure 28. The bottom pinned design makes engineering the exchange bias in the pinned layer 24 simply than in a top pinned design where the spin current metal line 40 overlies the free layer 26 of the magnetic tunnel junction structure 28. Placement of the selector element 80 and the third electrode 93 above the spin current metal line 40 provides greater flexibility in the layout of the selector element 80 and the third electrode 93, providing improved device scaling to smaller dimensions.

Figure 23:
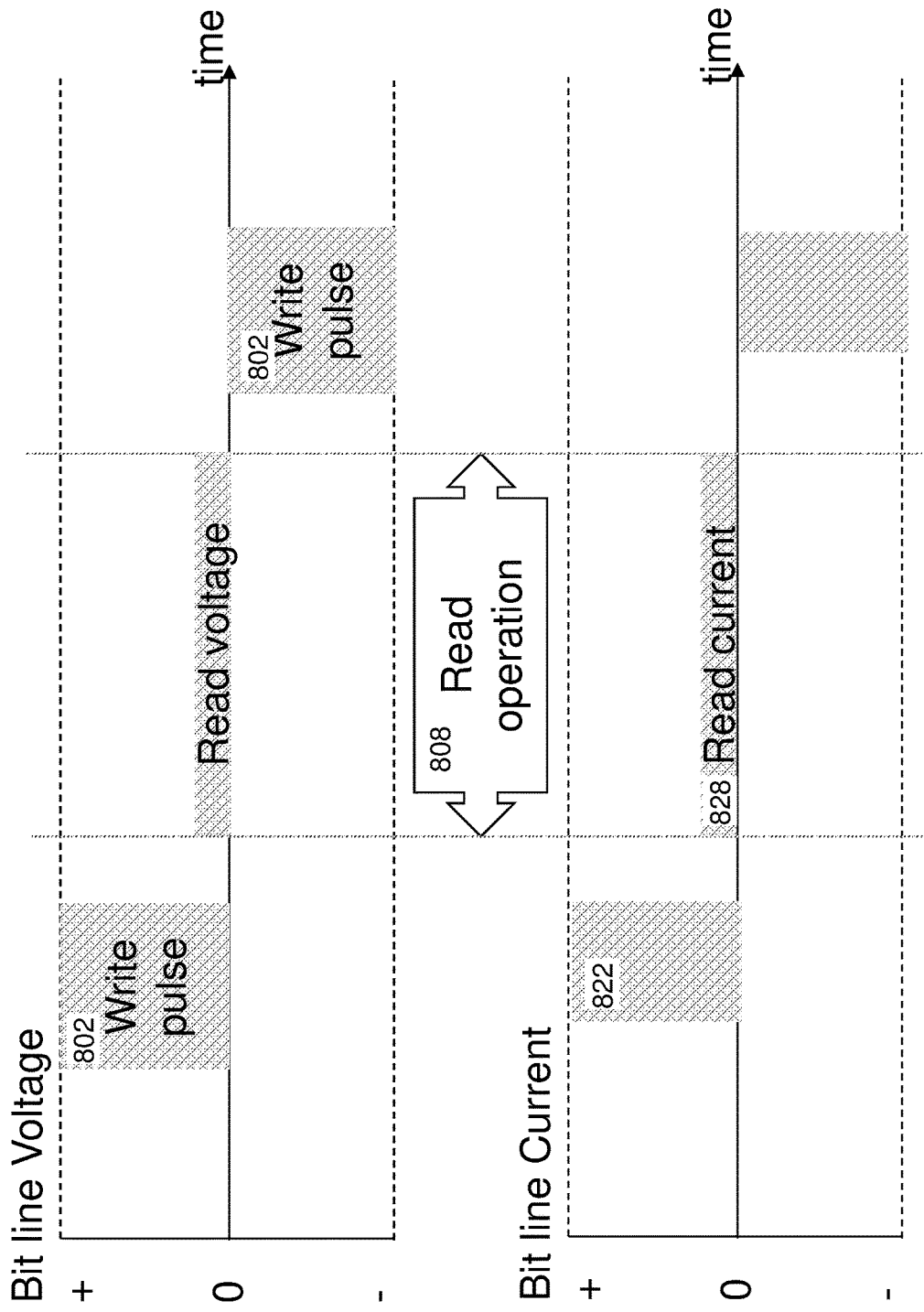
FIG. 23 illustrates plots of bit line voltage and current versus time during operation of the memory device according to the embodiments of the present disclosure.

Referring to FIG. 23, the operation of device 500 comprises a series or write and read operations. A write operation comprises of at least one write voltage pulse 802 on either the bit line 90 or the word line 30. The write pulse may also have a positive or negative voltage polarity. The write voltage pulse 802 has voltage greater than the threshold voltage needed to convert selector device 80 into its conductive state. The polarity of the voltage across the selector device 80 determines the direction of current on spin current metal line (i.e., the spin wire) 40, which translates into writing the MTJ device 20 into its high or low resistance state. Preferably, the write pulse has an absolute value of at least 2.5 V (e.g., +/−2.5 to +/−10V) and a pulse length less than 10 ns, such as 1 to 8 ns. There may also be a time delay of about 1 nanosecond before selector 80 converts from the non-conductive state to its conductive state, where time of the selector 80 in the conductive state defines the time of the write current pulse 822. Furthermore, the voltage may rise and decay based on the local capacitance of the device 500 and the electrical resistance of the bit line 90 and word line 30.

Figure 24B:
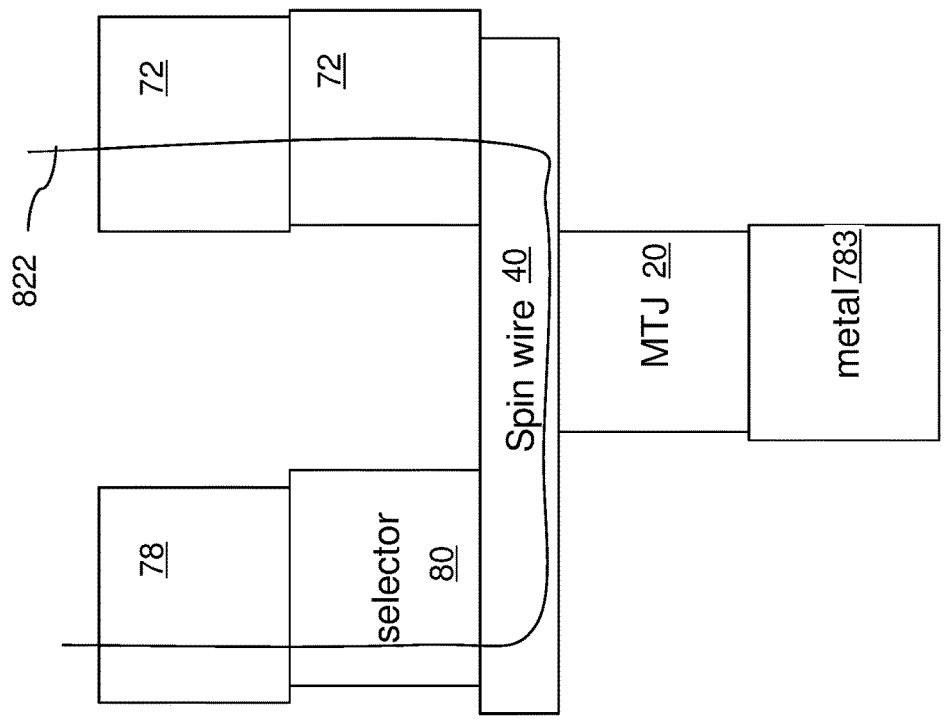
FIGS. 24A and 24B are schematic vertical cross-sectional views of the exemplary structures illustrating current flow through the exemplary structures during read and write operations, respectively.
Figure 24A:
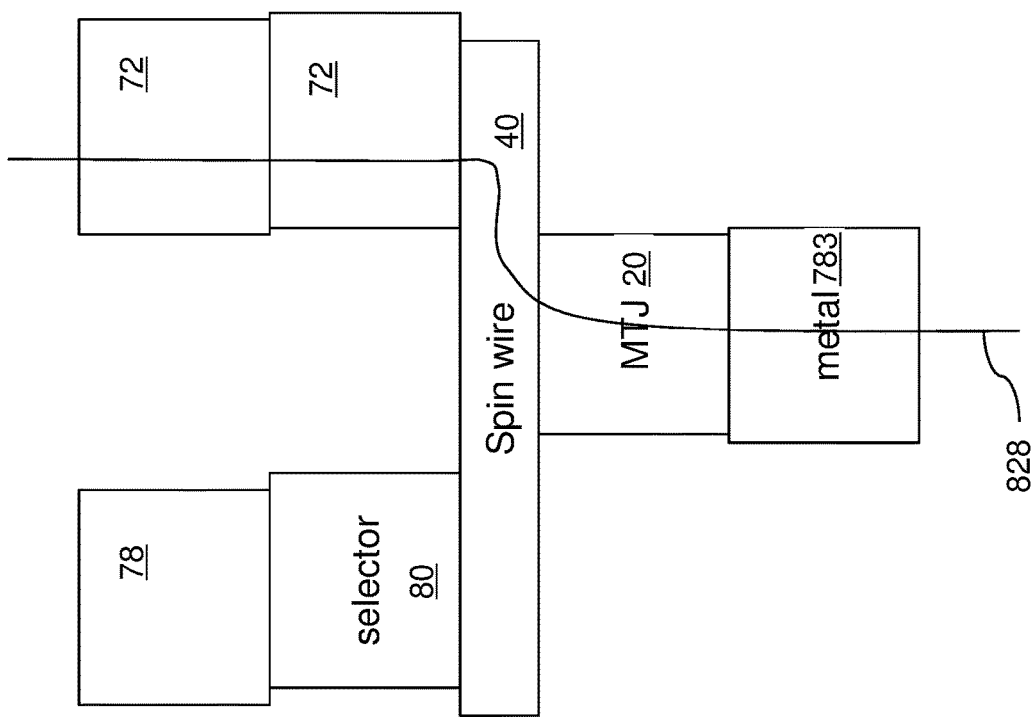

Referring to FIG. 24A, the path of the read current 828 passes through MTJ pillar 20. Referring to FIG. 24B, the path of the write current 822 passes through the center portion of the spin current metal line (i.e., the spin wire) 40. However, some of the write current 822 can shunt through a portion of the MTJ pillar 20 during the write operation.

During the write operation, all the current passes through the selector 80. However, a small amount of the current may be shunted from spin current metal line (i.e., the spin wire) 40 through MTJ pillar 20. Preferably, the current passing through MTJ pillar 20 is less than 10% of the current passing through the bit line 90. This small amount current passing through MTJ pillar 20 may be used to assist in the write process (i.e., in the process of switching the resistance state of the MTJ pillar 20) by a small amount of spin transfer torque (STT) applied across the free layer 26.

The read operation 808 utilizes circuitry to put a small read voltage across the MTJ pillar structure 20 which leads to a sense circuit to read the resistance state of MTJ pillar structure 20. The magnitude of the read voltage 828 is less than half of the write pulse voltage 802. Preferably the read voltage magnitude is 10% or less of the write pulse voltage 808. As an example, the write voltage pulse may be +/−2.5 V and the read voltage applied across the MTJ pillar structure 20 may be 0.25V or less, such 0.1 to 0.25V. The read voltage may be unipolar (e.g., always a positive voltage). The read voltage pulse width may be less than 10 ns, such as 1 to 8 ns. The read current 828 used to read the state of the MTJ pillar structure 20 does not pass through the selector 80, but follows the ohmic path along the bit line 90 to the external circuitry to sense the resistance state of the MTJ pillar structure 20. Furthermore, the read operation 808 can be unipolar to simplify the circuitry that is part of the read operation 808.

Both the write and read voltage pulses may comprise a square pulse or a more complex shape than the square pulse. The pulse shape may comprise a rising ramp, falling ramp, or intermediate pulses with gaps which depend on the reading algorithm and external circuitry.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A spin-orbit-torque (SOT) magnetoresistive memory device comprising at least one SOT memory cell, wherein each of the at least one SOT memory cell overlies a substrate and comprises:
    a first electrode embedded in dielectric material layers overlying the substrate;
    a magnetic-tunnel-junction-containing (MTJ-containing) pillar structure contacting a top surface of the first electrode and comprising a ferromagnetic pinned layer, a ferromagnetic free layer that overlies the pinned layer, a tunneling barrier layer located between the free layer and the pinned layer, and a nonmagnetic coupling layer that overlies the free layer;
    a spin current metal line including a portion that contacts the nonmagnetic coupling layer of the MTJ-containing pillar structure; and
    a second electrode and a third electrode which overlie the MTJ containing pillar structure and which are electrically connected to the spin current metal line.

2. The SOT magnetoresistive memory device of claim 1, wherein a bottom periphery of the nonmagnetic coupling layer coincides with a top periphery of the free layer.

3. The SOT magnetoresistive memory device of claim 1, further comprising:
    an MTJ-level dielectric material layer laterally surrounding the MTJ-containing pillar structure; and
    a stress-generating dielectric liner located on a top surface of the MTJ-level dielectric material layer and is coplanar with the spin current metal line.

4. The SOT magnetoresistive memory device of claim 3, wherein a top surface of the nonmagnetic coupling layer is located within a same horizontal plane as a top surface of the stress-generating dielectric liner.

5. The SOT magnetoresistive memory device of claim 3, wherein the spin current metal line contacts a top surface of the nonmagnetic coupling layer and a top surface of the stress-generating dielectric liner.

6. The SOT magnetoresistive memory device of claim 3, wherein a bottom surface of the stress-generating dielectric liner is located above a horizontal plane including a bottom surface of the free layer.

7. The SOT magnetoresistive memory device of claim 3, wherein the stress-generating dielectric liner comprises a carbon-based material including carbon at an atomic concentration greater than 90%.

8. The SOT magnetoresistive memory device of claim 3, wherein the stress-generating dielectric liner consists essentially of diamond-like carbon (DLC).

9. The SOT magnetoresistive memory device of claim 3, further comprising a metal via structure vertically extending through the MTJ-level dielectric material layer and the stress-generating dielectric liner and having a top surface located within a horizontal plane including a top surface of the stress-generating dielectric liner.

10. The SOT magnetoresistive memory device of claim 1, further comprising a passivation dielectric spacer laterally surrounding the MTJ-containing pillar structure.

11. The SOT magnetoresistive memory device of claim 1, further comprising a selector element that overlies, is electrically connected to a first end of the spin current metal line, and is laterally offset from the MTJ containing pillar structure.

12. The SOT magnetoresistive memory device of claim 11, wherein:
    the second electrode contacts a top surface of the selector element;
    the third electrode comprises a metal via structure contacting a segment of a top surface of the spin current metal line; and
    the third electrode is laterally offset from the MTJ containing pillar.

13. The SOT magnetoresistive memory device of claim 1, wherein the nonmagnetic coupling layer comprises at least one first metal having an atomic number in a range from 72 to 79 at a total atomic percentage greater than 90%.

14. The SOT magnetoresistive memory device of claim 13, wherein the spin current metal line comprises at least one second metal having an atomic number in a range from 72 to 79.

15. A data storage system comprising a plurality of the SOT magnetoresistive memory devices of claim 1.

16. The data storage system of claim 15, wherein:
    at least two of the plurality of the SOT magnetoresistive memory devices share a common word line connected to the second electrode; and
    at least two of the plurality of the SOT magnetoresistive memory devices share a common bit line connected to the third electrode.

17. A method of performing a reading operation on the SOT magnetoresistive memory device of claim 1, comprising:
    applying a read voltage pulse the first electrode to generate a write current which flows through the MTJ containing pillar structure and through the spin current metal line to the third electrode; and
    determining a resistance state of the SOT magnetoresistive memory device using an external circuitry based on a magnitude of the read current.

18. The method of claim 17, wherein:
    an absolute value of the read voltage pulse is less than or equal to 0.25V;
    the read voltage pulse is unipolar during the reading operation; and
    a length of the read voltage pulse is less than 10 nanoseconds.

19. A method of performing a writing operation on the SOT magnetoresistive memory device of claim 11, comprising applying a write voltage pulse to the second electrode to generate a write current which flows through the selector element and through the spin current metal line to the third electrode to change a resistance state of the MTJ containing pillar structure.

20. The method of claim 19, wherein:
an absolute value of the wrote voltage pulse is at least 2.5V;
the write voltage pulse has a positive or a negative polarity; and
a length of the write voltage pulse is less than 10 nanoseconds.

\* \* \* \* \*